United States Patent
Maccioni et al.

(10) Patent No.: US 11,448,564 B2
(45) Date of Patent: Sep. 20, 2022

(54) SENSOR ARRANGEMENT AND METHOD OF OPERATING A SENSOR ARRANGEMENT

(71) Applicant: Sciosense B.V., AE Eindhoven (NL)

(72) Inventors: Alberto Maccioni, La Spezia (IT); Willem Frederik Adrianus Besling, Eindhoven (NL)

(73) Assignee: SCIOSENSE B.V., AE Eindhoven (NL)

( * ) Notice: Subject to any disclaimer, the term of this patent is extended or adjusted under 35 U.S.C. 154(b) by 18 days.

(21) Appl. No.: 17/053,182

(22) PCT Filed: Apr. 10, 2019

(86) PCT No.: PCT/EP2019/059149
§ 371 (c)(1),
(2) Date: Nov. 5, 2020

(87) PCT Pub. No.: WO2019/228700
PCT Pub. Date: Dec. 5, 2019

(65) Prior Publication Data
US 2021/0190615 A1    Jun. 24, 2021

(30) Foreign Application Priority Data
May 28, 2018    (EP) .................................... 18174623

(51) Int. Cl.
*G01L 9/12*    (2006.01)
*G01L 27/00*    (2006.01)
(Continued)

(52) U.S. Cl.
CPC .............. *G01L 9/0072* (2013.01); *G01L 9/12* (2013.01); *G01L 27/005* (2013.01); *H03M 3/34* (2013.01); *H03M 3/454* (2013.01); *H03M 3/458* (2013.01)

(58) Field of Classification Search
CPC ... G01L 9/0072; G01L 9/0073; G01L 9/0075; G01L 27/005
See application file for complete search history.

(56) References Cited

U.S. PATENT DOCUMENTS 7,142,142 B2    11/2006 Petersen et al.
7,142,143 B2    11/2006 Draxelmayr
(Continued)

FOREIGN PATENT DOCUMENTS

CN    1929778 A    3/2007
CN    105973134 A    9/2016
(Continued)

*Primary Examiner* — Herbert K Roberts
(74) *Attorney, Agent, or Firm* — Slater Matsil, LLP

(57) ABSTRACT

In an embodiment a sensor arrangement includes a pressure sensor realized as a capacitive pressure sensor, a capacitance-to-digital converter coupled to the pressure sensor and implemented as a delta-sigma analog-to-digital converter and a reference voltage generator having a control input configured to receive a control signal and an output configured to provide a reference voltage, wherein the output of the reference voltage generator is connected to an input of the capacitance-to-digital converter, wherein the reference voltage generator is configured to set a value of the reference voltage as a function of the control signal, and wherein at least two different values of the reference voltage have the same sign and different amounts.

12 Claims, 14 Drawing Sheets

(51) Int. Cl.
*G01L 9/00* (2006.01)
*H03M 3/00* (2006.01)

(56) References Cited

U.S. PATENT DOCUMENTS

| | | |
|---|---|---|
| 9,340,412 B2 | 5/2016 | Besling et al. |
| 9,628,104 B2 | 4/2017 | Wang et al. |
| 9,726,561 B2 | 8/2017 | Besling et al. |
| 9,897,504 B2 | 2/2018 | Wiesbauer et al. |
| 2001/0020850 A1 | 9/2001 | McIntosh et al. |
| 2007/0080695 A1 | 4/2007 | Morrell et al. |
| 2008/0022762 A1 | 1/2008 | Skurnik |
| 2013/0118265 A1 | 5/2013 | Besling et al. |
| 2013/0300437 A1* | 11/2013 | Grosjean ............ G01R 27/2605 324/661 |
| 2015/0285701 A1 | 10/2015 | Hammerschmidt |
| 2015/0295587 A1* | 10/2015 | Garcia Gonzalez ........ H03M 1/1019 341/120 |
| 2015/0321903 A1 | 11/2015 | Lloyd et al. |
| 2016/0131550 A1 | 5/2016 | Besling |
| 2016/0265995 A1* | 9/2016 | Wang ................ G01L 9/0072 |
| 2016/0305838 A1 | 10/2016 | Wiesbauer et al. |
| 2017/0023429 A1* | 1/2017 | Straeussnigg ......... H03M 3/462 |
| 2017/0322098 A1* | 11/2017 | Dawson ............... G01L 9/0072 |

FOREIGN PATENT DOCUMENTS

| | | |
|---|---|---|
| CN | 106066217 A | 11/2016 |
| CN | 107843363 A | 3/2018 |
| DE | 102004009611 A1 | 9/2005 |
| EP | 2653845 A1 | 10/2013 |
| EP | 2796844 A1 | 10/2014 |
| EP | 3650826 A1 | 5/2020 |
| EP | 3650827 A1 | 5/2020 |
| WO | 2008008403 A2 | 1/2008 |

\* cited by examiner

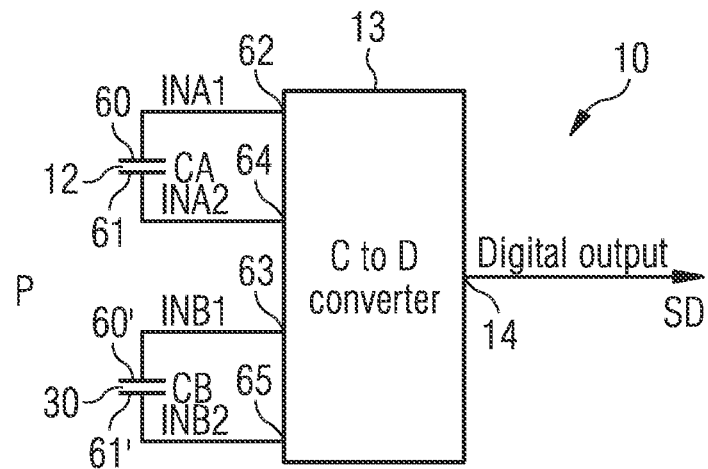
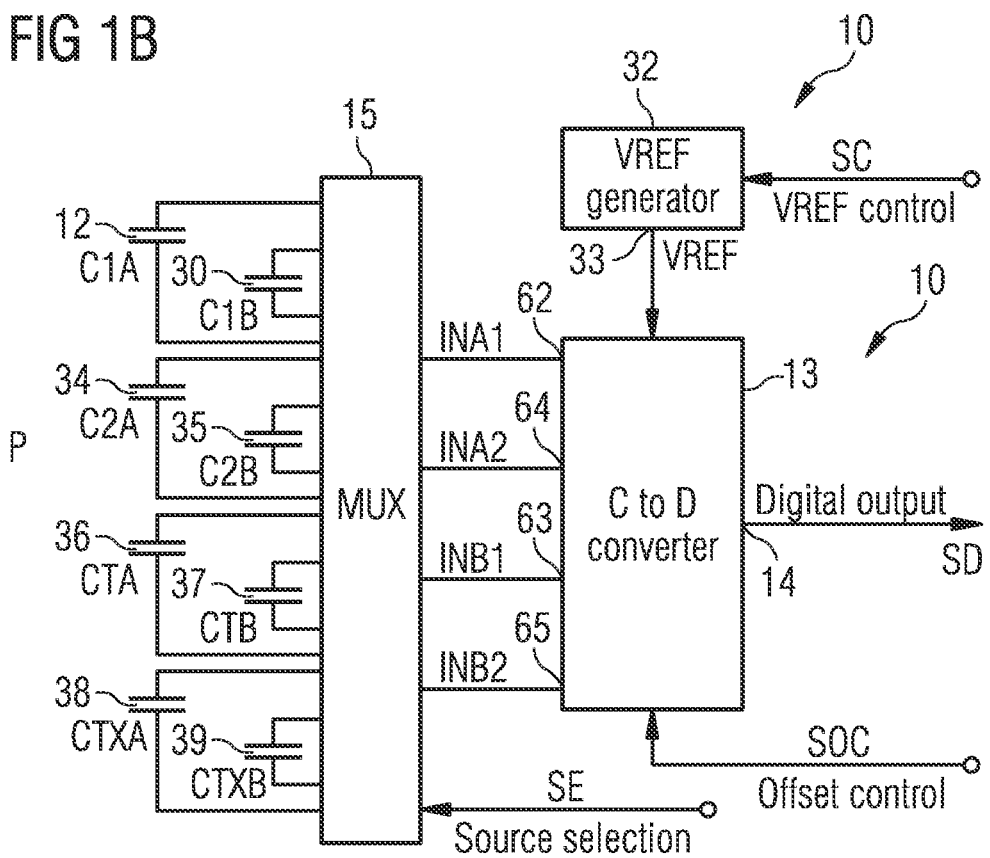

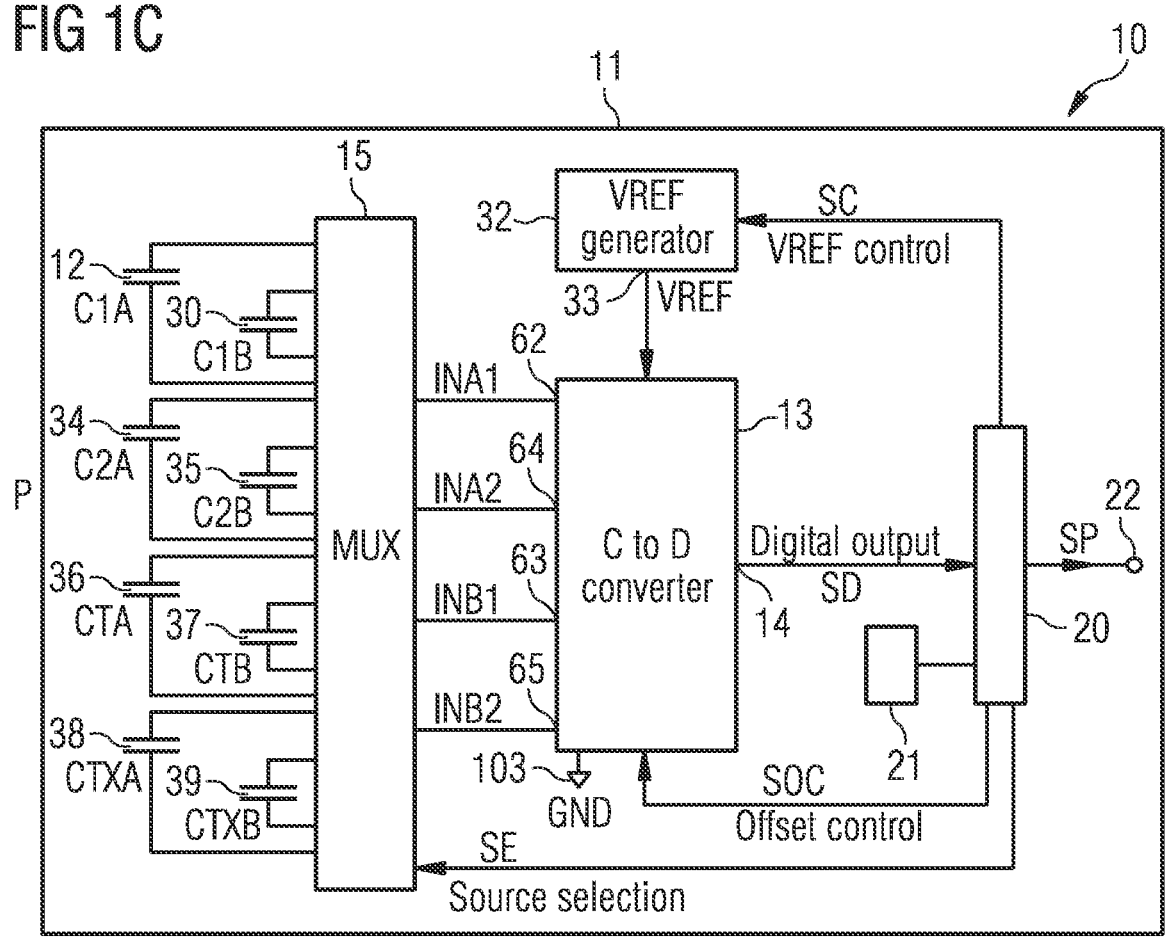
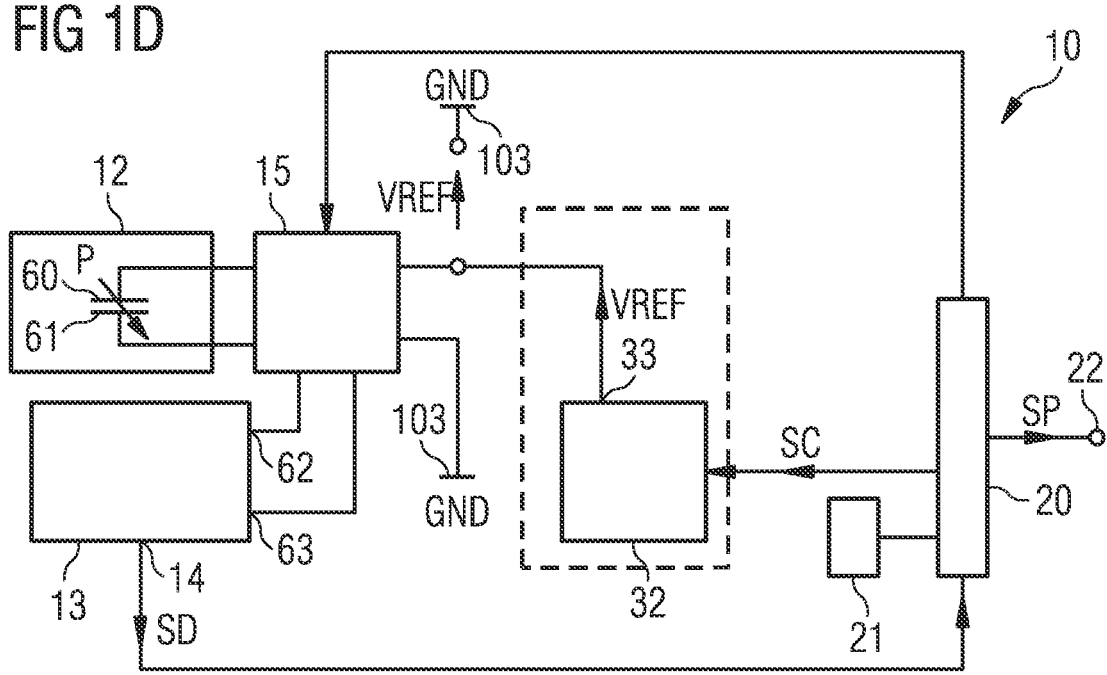

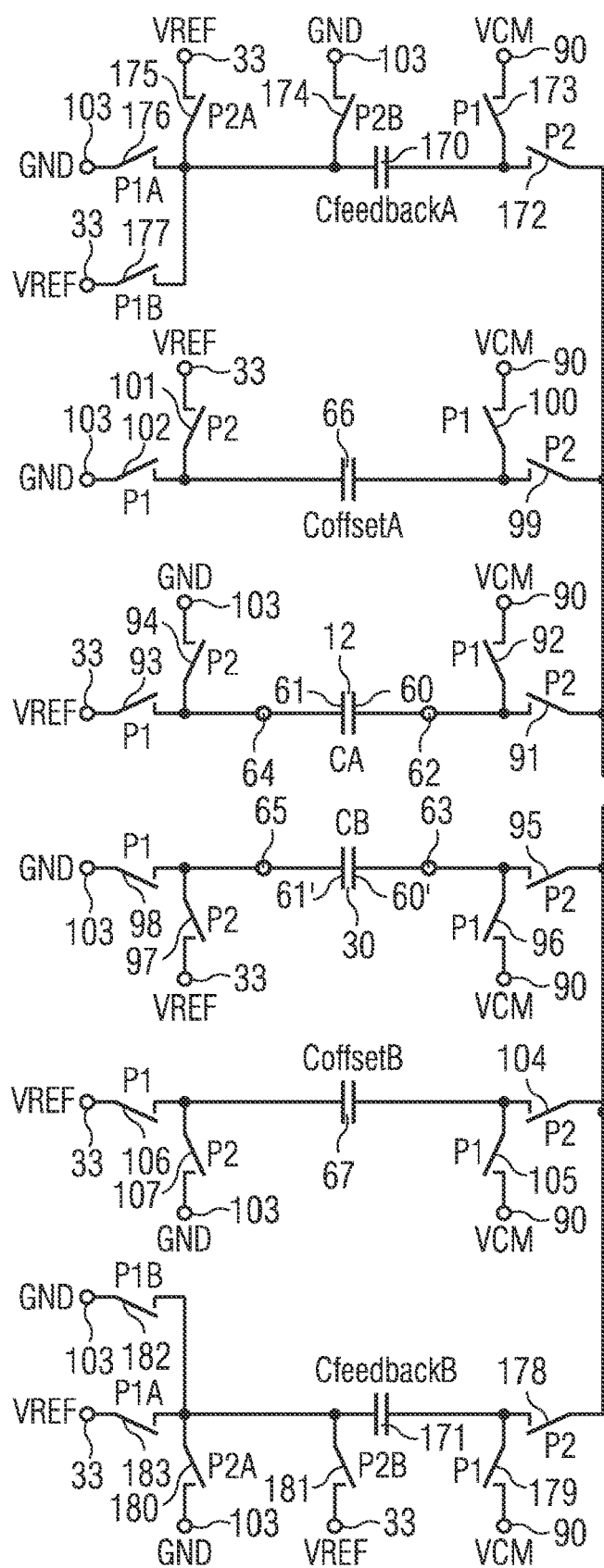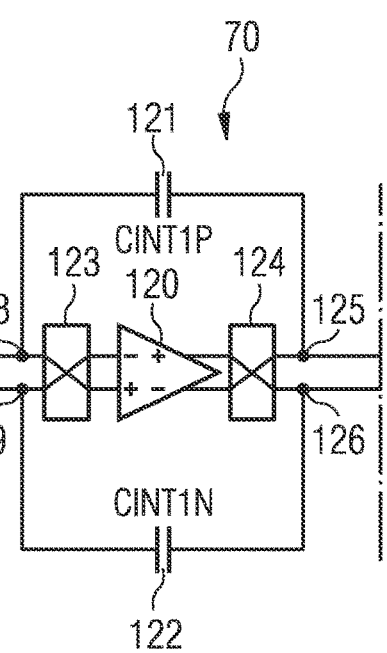

FIG 3Ha
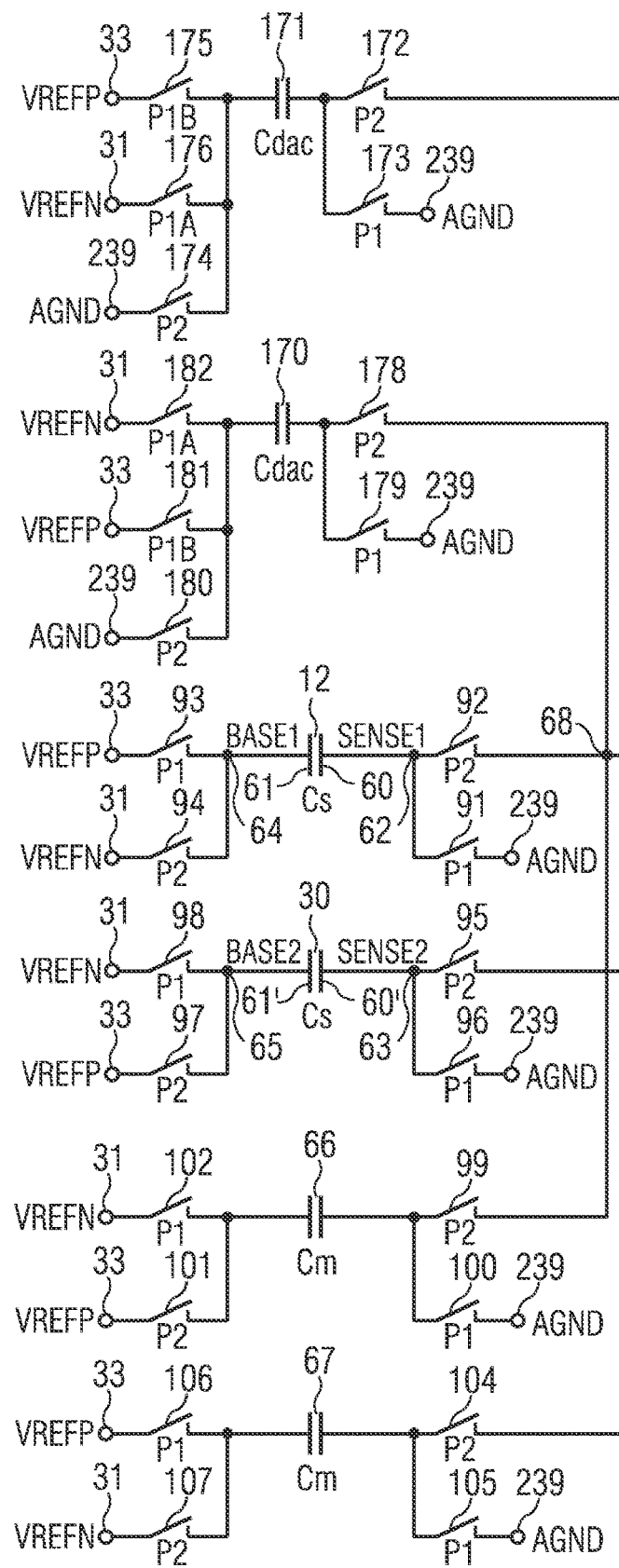

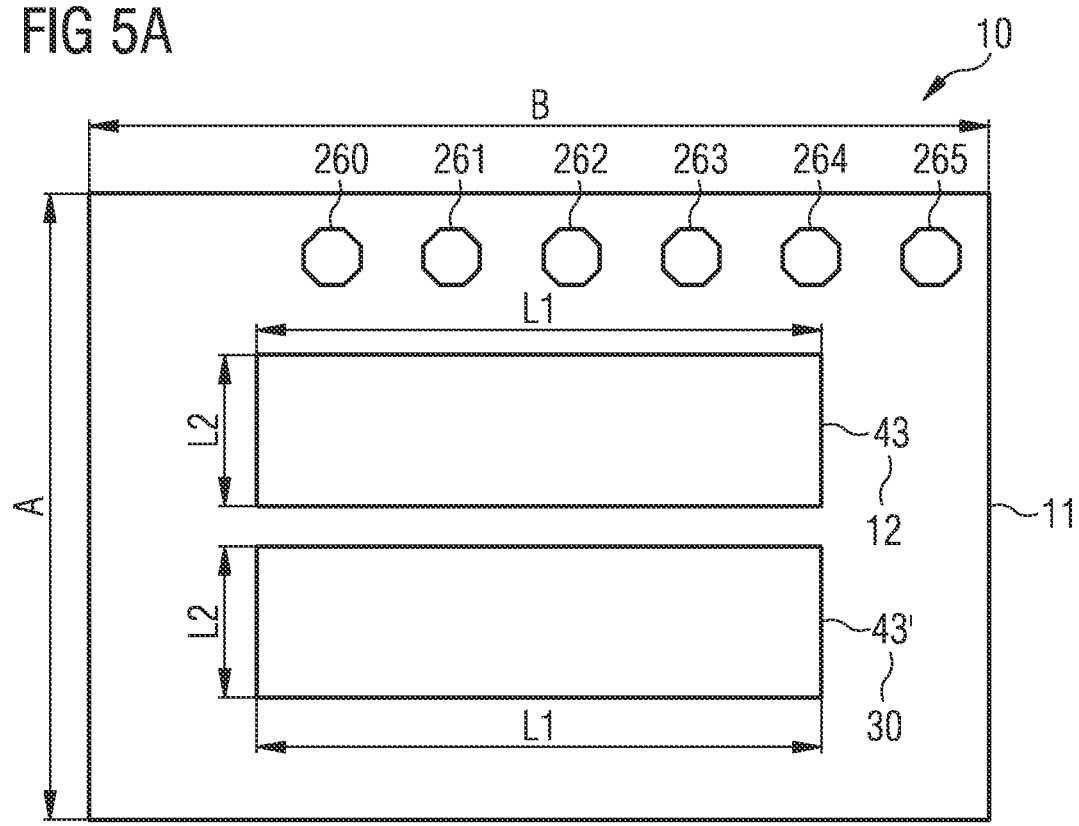

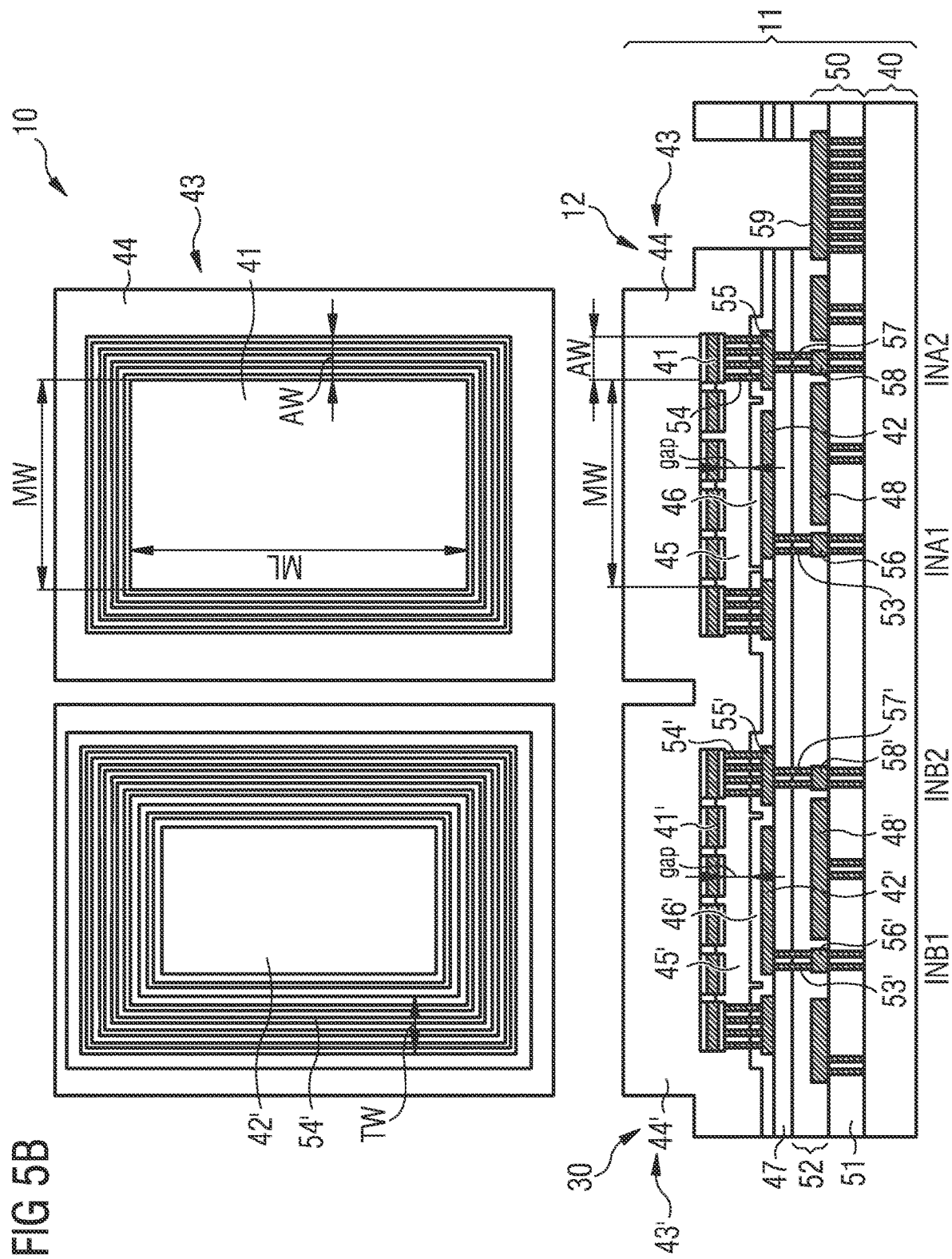

SENSOR ARRANGEMENT AND METHOD OF OPERATING A SENSOR ARRANGEMENT

This patent application is a national phase filing under section 371 of PCT/EP2019/059149, filed Apr. 10, 2019, which claims the priority of European patent application 18174623.1, filed May 28, 2018, each of which is incorporated herein by reference in its entirety.

TECHNICAL FIELD

The present disclosure is related to a sensor arrangement and to a method of operating a sensor arrangement.

BACKGROUND

A sensor arrangement comprises a sensor, for example, a pressure sensor. A pressure sensor typically has a membrane. The pressure sensor may also comprise two or more than two membranes. The membrane or membranes may be fabricated as a micro-electro-mechanical-system membrane, abbreviated as MEMS membrane. The membrane is deflected in the case of a pressure difference between the two sides of the membrane. A pressure sensor is often realized as a capacitive pressure sensor. Thus, the deflection of the membrane results in a change of a capacitance value of the pressure sensor. The pressure sensor is often connected to a capacitance-to-digital converter to generate a digital value that depends on the pressure difference between the two sides of the membrane. US Patent Application No. 2015/0295587 A1 shows an example of a capacitance-to-digital converter. The stability and sensitivity of a pressure measurement highly depends on the physical properties of the membrane. These physical properties may be different at different examples of a pressure sensor and may vary during the lifetime of the pressure sensor.

SUMMARY

In an embodiment, a sensor arrangement comprises a pressure sensor that is realized as capacitive pressure sensor, a capacitance-to-digital converter coupled to the pressure sensor and implemented as a delta-sigma analog-to-digital converter, and a reference voltage generator having a control input for receiving a control signal and an output for providing a reference voltage. The output of the reference voltage generator is connected to an input of the capacitance-to-digital converter. The reference voltage generator is configured to set a value of the reference voltage as a function of the control signal. At least two different values of the reference voltage have the same sign and different amounts.

Advantageously, at least two different values of the reference voltage can be applied to the pressure sensor. Thus, the distance of a first electrode of the sensor to a second electrode of the pressure sensor can be varied by the at least two different values of the reference voltage. The first electrode may be the membrane or a part of the membrane of the pressure sensor. Thus, the pressure sensor can be tested using the different values of the reference voltage.

In an embodiment, the sensor arrangement is realized as a semiconductor body. The semiconductor body comprises the pressure sensor, abbreviated sensor, and the capacitance-to-digital converter, abbreviated converter or convertor. Advantageously, the connections of the sensor to the converter can be kept short.

In an embodiment, the sensor arrangement comprises a further pressure sensor that is realized as a capacitive pressure sensor. The capacitance-to-digital converter is coupled to the further pressure sensor, abbreviated further sensor.

An accuracy can be increased by the use of two sensors.

In an embodiment, the semiconductor body comprises the further sensor. Advantageously, the sensor and the further sensor are produced with the same fabrication steps.

In an embodiment, the sensor arrangement comprises a digital circuit coupled to the capacitance-to-digital converter and the reference voltage generator. The sensor arrangement comprises a memory connected to the digital circuit. The digital circuit is configured to generate the control signal.

In an embodiment, in a test phase of operation, the digital circuit is configured to control the reference voltage generator by the control signal such that the reference voltage generator consecutively generates at least two different values of the reference voltage. The capacitance-to-digital converter is configured to generate at least two values of a digital signal depending on a capacitance value of at least one sensor of a group comprising the pressure sensor and the further pressure sensor. The digital circuit is configured to generate a parameter A0 and/or correction data depending on the at least two values of the digital signal. Advantageously, the sensor arrangement is configured to perform a calibration only using circuit parts which are part of the sensor arrangement.

In an embodiment, in the test phase of operation, the values of the reference voltage and the values of the digital signal are used to determine the parameter A0 and/or the parameter B0 and/or the parameter C0 using e.g. one of the following equations:

$$C = C0 + B0 \cdot VREF + A0 \cdot VREF^2, \text{ or}$$

$$C = C0 + A0 \cdot VREF^2,$$

wherein C is a capacitance value CA, CB of at least one sensor of a group comprising the pressure sensor and the further pressure sensor, VREF is the value of the reference voltage or a voltage applied between the first and the second electrode of the at least one sensor and C0, B0 and A0 are parameters. Sometimes, C0 is written as A2 and B0 is written as A1.

In an embodiment, the digital circuit is configured to store the parameter A0 or correction data in the memory.

In an embodiment, in a measurement phase of operation, the digital circuit is configured to generate a digitized pressure signal depending on a digital signal provided by the capacitance-to-digital converter and depending on the parameter A0 and/or the correction data stored in the memory. The measurement phase of operation follows the test phase of operation.

In an embodiment, the sensor arrangement is configured to determine a mismatch such as a mismatch of a parameter A0 between the pressure sensor and the further pressure sensor. Advantageously, data only of correctly operating sensors are used for generating the digitized pressure signal.

In an embodiment, an apparatus comprises the sensor arrangement. The apparatus is realized as one of a mobile device, a wearable, a medical device, a vehicle and an air conditioner.

In an embodiment, a method of operating a sensor arrangement comprises receiving a control signal at a control input of a reference voltage generator, providing a reference voltage at an output of the reference voltage generator, and measuring a capacitance of a pressure sensor by a capacitance-to-digital converter as a function of the reference voltage provided to the sensor by the capacitance-to-digital converter. The pressure sensor is realized as capacitive pressure sensor. The capacitance-to-digital converter is implemented as a delta-sigma analog-to-digital converter. The output of the reference voltage generator is connected to an input of the capacitance-to-digital converter. The reference voltage generator sets a value of the reference voltage as a function of the control signal. At least two different values of the reference voltage have the same sign and different amounts.

In an embodiment, the reference voltage is a DC voltage.

In an embodiment, the reference voltage is applied between a first electrode of the pressure sensor and a second electrode of the pressure sensor.

In an embodiment, in a test phase of operation, at least two different values of the reference voltage are provided by the capacitance-to-digital converter to the sensor. The capacitance-to-digital converter generates at least two values of a digital signal depending on a capacitance value of the sensor. A digital circuit generates a parameter A0 and/or correction data depending on the at least two values of the digital signal.

In an embodiment, in the test phase of operation, the measurement at exactly two values of the reference voltage gives relevant information such as the parameters A0 and C0, if the parameter B0 is set to 0. Thus, the equation may be used: $C = C0 + A0 \cdot VREF^2$.

In an embodiment, in the test phase of operation, at least three different values of the reference voltage are provided by the capacitance-to-digital converter to the sensor. The capacitance-to-digital converter generates at least three values of the digital signal depending on a capacitance value of the sensor. The digital circuit generates the parameter A0 and/or correction data depending on the at least three values of the digital signal. Thus, one of the equations may be used: $C = C0 + A0 \cdot VREF^2$ or $C = C0 + B0 \cdot VREF + A0 \cdot VREF^2$.

In one embodiment, the parameter A0 can only be derived properly when the capacitance value of the sensor is measured at at least three values of the reference voltage, because the bottom of the C-V curve is not necessarily at VREF=0 V due to built-in-charges.

In one embodiment, the capacitance value of the sensor cannot be measured properly if no reference voltage is used.

The method of operating a sensor arrangement may be implemented e.g. by the sensor arrangement according to one of the embodiments defined above.

The present disclosure is related to a differential capacitive-to-digital converter design with four terminals employing a variable voltage reference.

Pressure sensors are strain sensitive devices. During final test mechanical strains are imposed on the package and hence they can be transferred to the pressure sensitive membrane. A larger membrane stress results typically in smaller membrane deflection and therefore the apparent pressure reading shifts to lower pressure. The mechanical loading during calibration results in a stress condition that is compensated for in the calibration algorithm. The calibration constants that are stored into the memory of the device belong to the stress state during final test. However, the device will not give correct readings anymore after removing the mechanical stress condition. After solder mounting the pressure sensitive device, the pressure sensor will be exposed to thermal stress due to the thermal expansion coefficient mismatch of the pressure sensor package and the PCB material (PCB is the abbreviation for printed circuit board). These different stress conditions are also not compensated for and result in further deviations from the actual ambient pressure. Due to aging, the sensor can also experience different stress conditions over time e.g. due to glue hardening. Also different humidity levels can make glue or PCB materials swell which will have an impact on the pressure output reading.

The disclosure is related to measuring the transducer characteristics during calibration and correlating them to the transducer characteristics after solder mounting them on the customer PCB material. As such the disclosure can be used to compensate for different stress conditions during test, assembly and over lifetime.

The disclosure is based on a capacitance-to-digital convertor or converter (shorted C2D) design that is used as read-out for the capacitive pressure sensor. Using this C2D convertor the transducer capacitance can be measured as function of voltage. With this method the membrane compliance and pressure sensitivity can be extracted. Upon applying a voltage bias the pressure sensitive membrane is attracted by electrostatic forces towards a counter electrode. The increased membrane deflection can be sensed by an increase in the capacitance. The larger the capacitance change for a certain membrane separation the larger the pressure sensitivity of the device. The C2D convertor is configured differentially and has four terminals. Two matched pressure sensitive membranes may be connected to the C2D convertor.

The two pressure sensitive membranes may be directly constructed on top of a CMOS read-out circuit in order to reduce parasitic capacitances and reduce noise.

A pressure-sensitive membrane may be characterized e.g. without the readout ASIC by probing it on the wafer and measuring the capacitance-to-voltage response with a network or impedance analyzer.

A certain area in every production wafer may be dedicated to test membranes that are not used in the final product. Although these Process Control Monitor (PCM) structures give general feedback on membrane compliance, stack heights, film thickness etc. they cannot be used to calibrate individual devices located around or even adjacent to the PCM's. An integrated solution i.e. a capacitance to digital convertor with a bias-able reference voltage derives for each individual device the characteristic device properties such as the capacitance-to-voltage response (A0 parameter).

The sensor arrangement may be configured e.g. to at least one of:
  Low noise capacitance conversion due to differential read-out.
  Possibility of measuring C-V curves (C-V is the abbreviation for capacitance-versus-voltage or capacitance voltage).
  Measuring mismatch of two capacitances.
  Extraction of pressure sensitivity/membrane compliance after calibration and after assembly using on-chip read-out circuitry.
  Re-adjustment of calibration parameters based on sensitivity analysis using the on-chip C-V measurement method.

In an embodiment, the sensor arrangement is based on a differential capacitance-to-digital convertor design for a capacitive pressure sensor with two pressure sensitive membranes and e.g. four terminals. The voltage reference of the capacitance to digital convertor can be altered in order to create a variable electrostatic attraction of the flexible, pressure sensitive membrane towards the fixed bottom electrode. The capacitance is then measured as function of applied voltage. In normal operation (e.g. in a measurement phase), the reference voltage is fixed. In test mode (e.g. in a test phase), the capacitance change is recorded for the different reference voltages.

BRIEF DESCRIPTION OF THE DRAWINGS

The following description of figures of embodiments may further illustrate and explain aspects of the sensor arrangement and the method of operating a sensor arrangement. Devices and circuit parts with the same structure and the same effect, respectively, appear with equivalent reference symbols. In so far as devices or circuit parts correspond to one another in terms of their function in different figures, the description thereof is not repeated for each of the following figures.

FIGS. 1A to 1D show examples of a sensor arrangement;
FIGS. 5A and 5B show further examples of a sensor arrangement.

DETAILED DESCRIPTION OF ILLUSTRATIVE EMBODIMENTS

Figure 2:
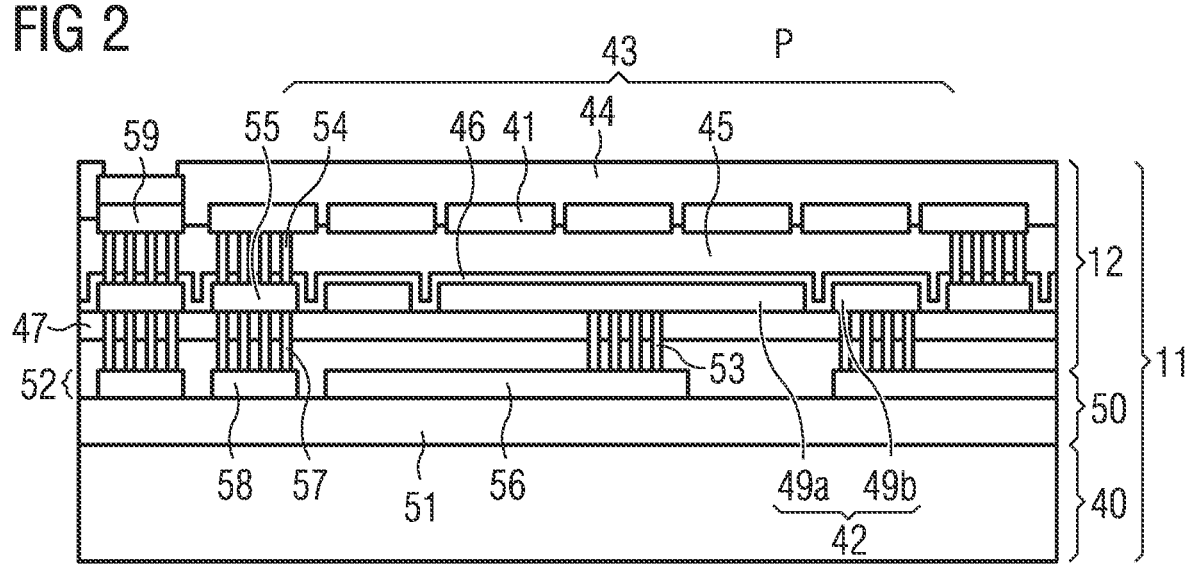
FIG. 2 shows an example of a pressure sensor.

FIG. 1A shows an example of an embodiment of a sensor arrangement 10 (abbreviated as arrangement). The arrangement 10 comprises a pressure sensor 12 that is realized as a capacitive pressure sensor and is abbreviated as sensor. The pressure sensor 12 has a capacitance CA (which may be named C1). Thus, the sensor arrangement 10 is realized as a pressure sensor arrangement. The arrangement 10 comprises a capacitance-to-digital converter 13, abbreviated as converter. The converter 13 is coupled to the sensor 12. The sensor 12 comprises a first and a second electrode 60, 61. The arrangement 10 comprises a further pressure sensor 30 realized as further capacitive pressure sensor and abbreviated as further sensor. The further sensor 30 has a further capacitance CB (which may be named C2). The further sensor 30 includes a first and a second electrode 60', 61'.

The converter 13 comprises a first and a second input 62, 63. The first electrode 60 of the sensor 12 is coupled to the first input 62 of the converter 13 and the first electrode 60' of the further sensor 30 is coupled to the second input 63 of the converter 13. The second electrode 61 of the sensor 12 may be coupled to a third input 64 of the converter 13 and the second electrode 61' of the further sensor 30 may be coupled to a fourth input 65 of the converter 13. The converter 13 comprises an output 14. The inputs 62 to 65 may be realized as terminals, outputs or combined inputs/outputs.

The capacitance CA and the further capacitance CB depend on a pressure P applied to the arrangement 10. At the output 14 of the converter 13 a digital signal SD is provided. The digital signal SD can also be named digital output or digital output signal. The converter 13 converts the capacitance CA and the further capacitance CB into the digital signal SD. Thus, the digital signal SD is a function of the pressure P. In FIG. 1A, a schematic block diagram of the electrical circuit of the sensor arrangement 10 is shown. The sensor arrangement 10 is realized with the capacitance-to-digital convertor 13 with four input terminals 62 to 65.

FIG. 1B shows a further example of the sensor arrangement 10 that is a further development of the example shown in FIG. 1A. In FIG. 1B, an expanded block diagram of the electrical circuit of the sensor arrangement 10 is illustrated. The arrangement 10 comprises a switching circuit 15. The switching circuit 15 may be implemented as a multiplexer, shorted MUX. The switching circuit 15 couples the converter 13 to the sensor 12 and to the further sensor 30. The first and the second input 62, 63 of the converter 13 is coupled via the switching circuit 15 to the first electrode 60 of the sensor 12 and to the first electrode 60' of the further sensor 30. Similarly, the third and the fourth input 64, 65 of the converter 13 may be coupled via the switching circuit 15 to the second electrode 61 of the sensor 12 and to the second electrode 61' of the further sensor 30.

Moreover, the sensor arrangement 10 comprises a reference voltage generator 32, abbreviated generator. An output 33 of the generator 32 is connected to an input of the converter 13. The arrangement 10 may comprise a first to a sixth capacitor 34 to 39. The converter 13 is coupled via the switching circuit 15 to the first to the sixth capacitor 34 to 39. The first to the sixth capacitor 34 to 39 may be realized as additional pressure sensors and/or as fixed capacitors. The fixed capacitors are pressure in-sensitive. The capacitance CA shown in FIG. 1A corresponds to the capacitance C1A shown in FIG. 1B. The capacitance CB shown in FIG. 1A corresponds to the capacitance C1B shown in FIG. 1B.

In an example, the switching circuit 15 may couple at least one of the first, third and fifth capacitor 34, 36, 38 having capacitances C2A, CTA, CTXA to the converter 13 instead of the sensor 12 or parallel to the sensor 12. The switching circuit 15 may couple at least one of the second, fourth and sixth capacitor 35, 37, 39 having capacitances C2B, CTB, CTXB to the converter 13 instead of the further sensor 30 or parallel to the further sensor 30 (e.g. as shown in FIG. 3E). Thus, in case of a defect, the pressure sensor 12, 30 may be replaced by another sensor or a capacitance value to be measured by the converter 13 may be increased.

A control signal SC is provided to the generator 32. The control signal SC may be named VREF control. The generator 32 generates a reference voltage VREF. The reference voltage VREF depends on the control signal SC. The reference voltage VREF is provided to the converter 13. An offset control signal SOC is provided to the converter 13. A source selection signal SE is applied to the switching circuit 15.

FIG. 1C shows a further example of the sensor arrangement 10 that is a further development of the embodiments shown in FIGS. 1A and 1B. The arrangement 10 is realized on a semiconductor body 11. The sensor 12, the further sensor 30 and the converter 13 are realized on a first surface of the semiconductor body 11. The switching circuit 15 and the generator 32 are also realized on the first surface of the semiconductor body 11. The fixed capacitors 34 to 39 may be implemented, for example, as metal-isolator-metal capacitors on the first surface of the semiconductor body 11.

Moreover, the sensor arrangement 10 comprises a digital circuit 20 that is coupled to the converter 13, the generator 32 and the switching circuit 15. The digital circuit 20 receives the digital signal SD. The digital circuit 20 generates the control signal SC, the offset control signal SOC and the source selection signal SE. Additionally, the sensor arrangement 10 comprises a memory 21 coupled to the digital circuit 20. The converter 13 is connected to a reference potential terminal 103. At the reference potential terminal 103, a reference potential GND can be tapped. The digital circuit 20 comprises an output 22. A digitized pressure signal SP is provided at the output 22 of the digital circuit 20. The converter 13 may provide the reference voltage VREF to the switching circuit 15, for example via one of the inputs 62-65 in a particular phase or phases of the conversion. The converter 13 may provide the reference potential GND to the switching circuit 15, for example via one of the inputs 62-65 also in a phase or phases of the conversion.

Two capacitive pressure sensor membranes 12, 30 are directly integrated on top of CMOS, CMOS circuit, CMOS die or CMOS semiconductor body 11. Hence, the double capacitors 12, 30 are in the same die as the converter 13 (no connection lines to the CDC converter, especially no bonding wires of flip-chip connections). The two sensors 12, 30 are exactly the same and have the same parasitic capacitors which are however very small and not shown here. Their response to the quantity to be measured is the same. In this disclosure, the capacitor is double, connected to two complementary inputs 62, 63 of the CDC converter 13. The sensor arrangement 10 is realized as a differential configuration for the capacitance-to-digital convertor design for capacitive pressure sensors using four input terminals 62 to 65 (i.e. the terminals are not allowed to be shared). Dual membranes 12, 30 are connected to the capacitance-to-digital convertor 13 (shorted CDC) with four terminals 62 to 65.

For an alternative capacitive pressure sensor, a single ended capacitance-to-digital convertor topology may be employed for the capacitance read-out. The pressure sensor may using a stand-alone MEMS capacitive pressure sensor element that may be connected via wirebonds to the read-out ASIC. A single pressure sensitive membrane configuration may be used.

In an alternative embodiment, not shown, the arrangement 10 comprises less capacitors 34 to 39 than are shown in FIGS. 1B and 1C. For example, the arrangement 10 may comprise exactly one, exactly two or exactly four capacitors of the capacitors 34 to 39. The arrangement 10 may e.g. also be free of a further capacitor.

FIG. 1D shows a further example of the arrangement 10 that is a further development of the embodiments shown FIGS. 1A to 1C. The arrangement 10 may be free of the further pressure sensor 30. The generator 32 may generate two different values of the reference voltage VREF. Each of the two values may be positive. The generator 32 generates the two values of the reference voltage VREF for a test of the sensor 12. The generator 32 may be named as test circuit.

FIG. 2 shows an example of the sensor 12 that is realized in the embodiments shown in FIGS. 1A to 1D. The sensor 12 can be called capacitive pressure transducer. The semiconductor body 11 comprises a semiconductor substrate 40. The sensor 12 is realized on top of the semiconductor substrate 40. Integration of pressure sensitivity membrane or membranes on top of CMOS is realized. The semiconductor body 11 may be a CMOS semiconductor body. The sensor 12 comprises a top and a bottom electrode 41, 42. The top electrode 41 may be implemented as a top metal electrode. The bottom electrode 42 may be implemented as a bottom metal electrode. The sensor 12 comprises a membrane 43. The membrane 43 comprises the top electrode 41. Moreover, the membrane 43 comprises a dielectric layer 44. The dielectric layer 44 may be arranged on top of the top electrode 41. The dielectric layer 44 may be fabricated as a passivation sealing layer.

The sensor 12 comprises a cavity 45. The cavity 45 is between the top electrode 41 and the bottom electrode 42. The top electrode 41 is between the cavity 45 and the dielectric layer 44. The sensor 12 may comprise a further dielectric layer 46. The further dielectric layer 46 may be realized as an etch stop layer. The further dielectric layer 46 is arranged between the bottom electrode 42 and the cavity 45. The cavity 45 is fabricated by etching of a sacrificial layer (not shown in FIG. 2).

The semiconductor body 11 comprises a metallization stack 50. The metallization stack 50 comprises a first dielectric layer 51 and a first metallization layer 52. The metallization stack 50 may comprise further metallization layers and further dielectric layers not shown in FIG. 2. A part 56 of the first metallization layer 52 is connected by a via 53 to the bottom electrode 42. The top electrode 41 is also connected by a first via 54 to a metal layer 55. The metal layer 55 is connected by a second via 57 to a further part 58 of the metallization layer 52.

The semiconductor body 11 comprises the sensor 12 and an integrated circuit. The arrangement 10 may be realized as a device. The integrated circuit is realized by the semiconductor substrate 40 and the metallization stack 50. The parts 56, 58 of the metallization layer 52 are connected to the integrated circuit. The integrated circuit comprises the circuits shown in FIGS. 1A to 1D and 3A to 3H such as e.g. the converter 13, the switching circuit 15, the generator 32, the digital circuit 20 and the memory 21. The integrated circuit is realized as a complementary metal-oxide-semiconductor circuit, shorted as CMOS circuit. The semiconductor body 11 comprises a bond pad 59 e.g. for providing the digitized pressure signal SP. The integrated circuit may be designed as an ASIC. The semiconductor body 11 is realized as a die. The arrangement 10 is integrated on one die. The arrangement 10 is integrated on top of a CMOS die.

The not shown sacrificial layer is etched through holes in the top electrode 41. After removal of the sacrificial layer, the holes are closed by the dielectric layer 44. The borders of the cavity 45 are defined on the top by the top electrode 41 and the dielectric layer 44 filling the holes of the top electrode 41, on the bottom by the further dielectric layer 46 and at the sides by the via 54. The thickness of the membrane 43 is equal to the sum of the thickness of the top electrode 41 and of the thickness of the dielectric layer 44 on top of the top electrode 41. An area of the membrane 43 is defined by the via 54. The via 54 encircles the cavity 45. The further sensor 30 may be realized such as the sensor 12.

The sensor arrangement 10 implements a capacitance versus DC voltage bias method. If a DC voltage bias or DC bias voltage is applied between the bottom and the top electrode 41, 42, an electrostatic force causes the membrane 43 to deflect downwards. The capacitance C is increasing with a DC bias voltage (VDC) as $$C = C0 + A0 \cdot VDC^2,$$

wherein C is the capacitance CA of the sensor 12, C0 and A0 are parameters and VDC is a value of the voltage between the top and the bottom electrode 41, 42 of the sensor 12. This formula may be e.g. valid if the bottom of the C-V curve is centered around zero Volt. The top electrode 41 may be the first electrode 60 of the sensor 12 and the bottom electrode 42 may be the second electrode 61 of the sensor 12 or vice versa. The voltage VDC may be equal to the reference voltage VREF depending on the state of the switching circuit 15.

The parameter A0 depends on the membrane stiffness. A relative change of the membrane stiffness equals to the relative change of the parameter A0. The parameter A0 also depends on the atmospheric pressure P. For this reason, the parameter A0 is determined during wafer level and/or final test. When performed during e-sort at wafer level the out-of-spec devices can be separated from the devices that will be assembled in the final package. At final test during pressure calibration the parameter A0 is determined at various pressure and temperature points in order to extract the pressure-A0 and/or the temperature-A0 dependency. Later when the device is assembled in the end-application i.e. on the customer PCB, the changes in pressure-A0 and/or in the temperature-A0 behavior can used to correct for mechanical or thermal induced stress changes. A potential sensor output shift during life time e.g. due to outgassing, aging of materials like glue, and or stress changes will cause an additional shift in the dependency of the parameter A0 on the atmospheric pressure P.

A correlation between a change of the parameter A0 and the sensor output is found either by a physical model or by accelerated lifetime testing. By knowing this correlation, the ASIC can compensate the sensor output shifts by measuring changes of the parameter A0.

The sensor arrangement 10 may be implemented e.g. for at least one of:
The use of two identical capacitive sensors 12, 30 to directly generate a differential signal.
The possibility to measure the capacitance CA at various reference voltages VREF.
Mixed selection of capacitive sensors to detect mismatch.

Figure 3A:
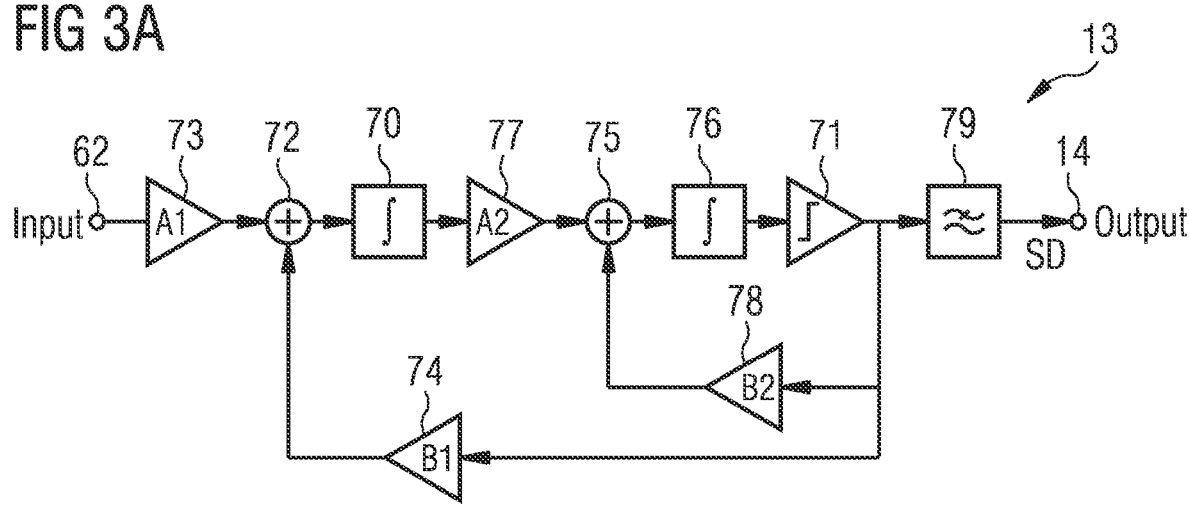
FIGS. 3A to 3Hb show further examples of a sensor arrangement.

An example of the sensor arrangement 10 may realize a single ended capacitance to digital convertor design (see FIG. 3A). The pressure transducer comprises a single capacitive pressure-sensor membrane-element.

Advantages of the arrangement 10 may be e.g. at least one of:
2× sensitivity improvement due to use of two membranes.
Linearity of capacitance range is significantly improved:
The non-linearity of the differential design of the converter 13 may be e.g. ten to thirty times lower in comparison to the non-linearity of a single ended design of a converter.
Common mode suppression due to differential design: Improves robustness against EMC disturbances (EMC stands for electromagnetic compatibility).
Membrane integration on CMOS: no parasitics due to absence of wire bonds.
Smaller membrane capacitance/range reduces overall capacitance noise, thereby improving pressure resolution.
Embedded capacitance-to-voltage characterization allows to compensate for stress changes and cavity pressure changes.

The sensor arrangement 10 is configured to integrate a surface micromachined capacitive pressure sensor 12 on top of a CMOS read-out circuit. The CMOS read-out circuit comprises a capacitance to digital convertor. The main advantages of the pressure sensor 12 with capacitive read-out compared to a sensor conventional piezo resistive read-out is an ultra-low power consumption and a much higher sensitivity. Furthermore, a significant improvement in form factor can be achieved, when the pressure sensitive membrane 43 is directly built on top of an integrated read-out circuit (single die solution). This approach allows to reduce parasitic capacitance and will, therefore, benefit from a better signal to noise ratio than stand-alone capacitive pressure sensor dies. Moreover, from form factor and packaging point of view, it is advantageous to construct pressure sensitive membranes on top of CMOS instead of using individual pressure transducer elements that need to be electrically connected i.e. wirebonded to the read-out circuit.

The capacitive pressure sensor 12 is directly constructed on top of the final passivation layer 51 of a CMOS circuit such as a CMOS read-out circuit. The pressure sensor technology will make use of common back-end of line (BEOL) layers for routing and shielding plates or shielding electrodes 48 (shown in FIG. 5B). The device 12 comprises the bottom electrode plate 42 and the top electrode plate 41 separated from each other by the cavity 45 and the isolation/etch stop layer 46. The movable membrane 43 deflects under the pressure P applied from the outside. A change in pressure P is directly correlated to a change in capacitance C between the metal electrode plates 41, 42. One of the metal electrode plates 41, 42, namely the top electrode 41, is integrated in the pressure sensitive membrane 43 and may be advantageously constructed of Ti/TiN/W. The bottom electrode plate 42 is fixed.

In order to create the free-hanging membrane 43 overlying the cavity 45, a sacrificial layer is being deposited over the bottom electrode 42 and the etch stop layer 46. The sacrificial layer will be removed through tiny holes etched in the membrane 43 using a dry etch method to avoid sticking. After the sacrificial etch, a suspended, perforated membrane 43 is formed which is subsequently sealed with a SiN dielectric film 44. A schematic cross section of the capacitive pressure sensor is shown in FIG. 2.

In an embodiment, the bottom electrode 42 is segmented as shown in FIG. 2. The bottom electrode 42 includes a central part 49a and an outer ring 49b around the central part 49a. The bottom electrode 42 can be connected to the converter 13 (e.g. via the switching circuit 15) to measure a capacitance between the central part 49a of the bottom electrode 42 and the top electrode 41, or between the outer ring 49b of the bottom electrode 42 and the top electrode 41. Due to the smaller separation between the central part 49a of the bottom electrode 42 and the top electrode 41, the electrostatic attraction will be significantly increased compared to the situation where the top electrode 41 is electrostatically actuated with the outer ring 49b of the bottom electrode 42.

In an alternative embodiment, the sensor 12 and the further sensor 30 may be different. For example, an area of the membrane 43 of the sensor 12 may be different from an area of a membrane of the further sensor 30. The layers 41, 44 forming the membrane 43 of the sensor 12 may be equal to the layers 41', 44' forming the membrane 43' of the further sensor 30.

In an alternative embodiment, not shown, the semiconductor body 11 comprises the sensor 12 and the integrated circuit. The integrated circuit comprises a subset of the circuits shown in FIGS. 1A to 1D and 3A to 3H such as e.g. the converter 13 and optionally also the switching circuit 15. A further semiconductor body comprises e.g. the generator 32, the digital circuit 20 and the memory 21.

FIG. 3A shows an example of the capacitance-to-digital converter 13 of the arrangement 10 that is a further development of the embodiments shown above. The converter 13 is realized as a delta-sigma analog-to-digital converter. The converter 13 may also be named as sigma-delta converter or delta-sigma converter. In FIG. 3A, an overview of the circuit structure is shown, namely a high level model of a second order sigma-delta modulator plus a filter 79 of the arrangement 10. The converter 13 comprises a first integrator 70, a quantizer 71 and a first adder 72. The first input 62 of the converter 13 is coupled to an input of the first adder 72. An output of the first adder 72 is coupled to an input of the first integrator 70. An output of the first integrator 70 is coupled to an input of the quantizer 71. An output of the quantizer 71 is coupled to the output 14 of the converter 13. Moreover, the output of the quantizer 71 is coupled to a further input of the first adder 72.

A first buffer 73 of the converter 13 may couple the first input 62 of the converter 13 to the input of the first adder 72. The first buffer 73 has an amplification factor A1. A second buffer 74 couples the output of the quantizer 71 to the further input of the first adder 72. The second buffer 74 has an amplification factor B1. Moreover, the converter 13 comprises a second adder 75 having an input coupled to the output of the first integrator 70. The output of the quantizer 71 is coupled to a further input of the second adder 75. The converter 13 comprises a second integrator 76 coupling an output of the second adder 75 to the input of the quantizer 71. A third buffer 77 couples the output of the first integrator 70 to the input of the second adder 75. The third buffer 77 has an amplification factor A2. A fourth buffer 78 couples the output of the quantizer 71 to the further input of the second adder 75. The fourth buffer 78 has an amplification factor B2. The quantizer 71 may be realized as a comparator (which is a 1-bit quantizer).

Additionally, the converter 13 comprises the filter 79. An output of the filter 79 is connected to the output 14 of the converter 13. The output of the quantizer 71 is connected to an input of the filter 79. The filter 79 is implemented as a low pass filter. The filter 79 is a digital filter. Thus, the converter 13 is realized as a two-stage converter.

In an alternative embodiment, the converter 13 is realized as a one-stage converter or comprises more than two stages.

In the example shown in FIG. 3A, the converter 13 includes only one input, namely the first input 62. However, the converter 13 may be realized as a differential converter additionally comprising the second input 63. Thus, the converter 13 performs a differential signal processing such as shown e.g. in the following figures.

Figure 3B:
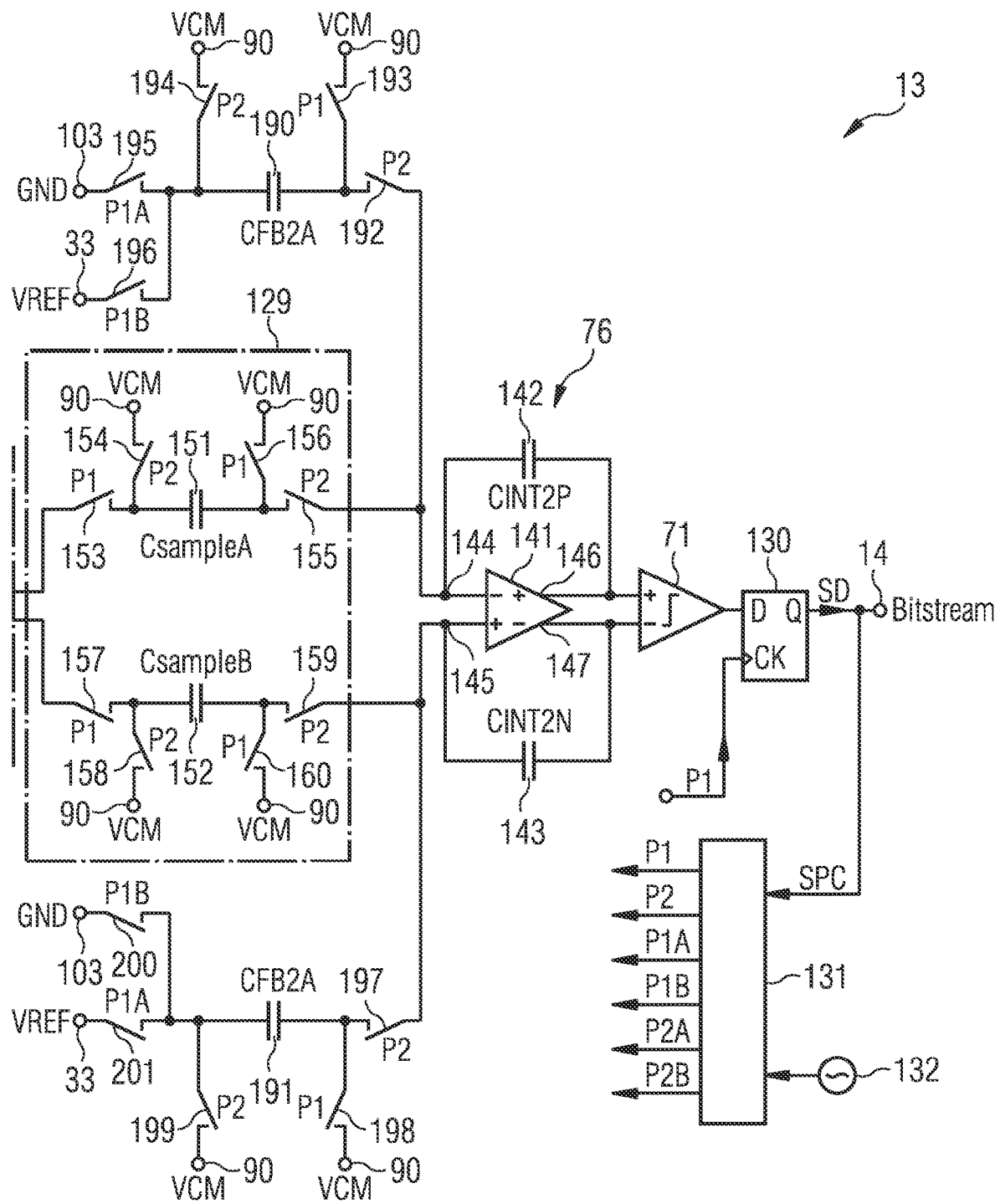

FIG. 3B shows a further example of the arrangement 10 with the converter 13 that is a further development of the embodiments shown in FIGS. 1A to 1D and FIG. 3A. The arrangement 10 comprises the sensor 12 having the capacitance value CA and the further sensor 30 having the capacitance value CB. Additionally, the converter 13 comprises a first and a second offset capacitor 66, 67. The first offset capacitor 66 has a capacitance value CoffsetA and the second offset capacitor 67 has a capacitance value CoffsetB. The arrangement 10 may be free of the switching circuit 15. The arrangement 10 may be free of any switch between the converter 13 and the sensor 12 and free of any switch between the converter 13 and the further sensor 30. Thus, the first and the second electrode 60, 61 of the sensor 12 are directly and permanently connected to the first and the third input 62, 64 of the converter 13. The first and the second electrode 60', 61' of the further sensor 30 are directly and permanently connected to the second and the fourth input 63, 65 of the converter 13.

The converter 13 includes a first to a fourth switch 91 to 94. The first input 62 of the converter 13 is coupled via the first switch 91 to a first input 68 of the first integrator 70. The second switch 92 couples the first input 62 of the converter 13 to a common mode terminal 90. The third switch 93 couples the third input 64 of the converter 13 to the output 33 of the generator 32. The fourth switch 94 couples the third input 64 of the converter 13 to the reference potential terminal 103.

Additionally, the converter 13 comprises a fifth to an eighth switch 95 to 98. The second input 63 of the converter 13 is coupled via the fifth switch 95 to a second input 69 of the first integrator 70. The sixth switch 96 couples the second input 63 of the converter 13 to the common mode terminal 90. The seventh switch 97 couples the fourth input 65 of the converter 13 to the output 33 of the generator 32. The eighth switch 98 couples the fourth input 65 of the converter 13 to the reference potential terminal 103.

Moreover, the converter 13 comprises a ninth to a sixteenth switch 99 to 102, 104 to 107. A first electrode of the first offset capacitor 66 is coupled via the ninth switch 99 to the first input 68 of the first integrator 70 and via the tenth switch 100 to the common mode terminal 90. A second electrode of the first offset capacitor 66 is coupled via the eleventh switch 101 to the output 33 of the generator 32 and via the twelfth switch 102 to the reference potential terminal 103.

A first electrode of the second offset capacitor 67 is coupled via the thirteenth switch 104 to the second input 69 of the first integrator 70 and via the fourteenth switch 105 to the common mode terminal 90. A second electrode of the second offset capacitor 67 is coupled via the fifteenth switch 106 to the output 33 of the generator 32 and via the sixteenth switch 107 to the reference potential terminal 103.

The first integrator 70 is implemented as a differential integrator. The first integrator 70 comprises an amplifier 120 and a first and a second integrating capacitor 121, 122. The first and the second integrating capacitor 121, 122 couple an input side of the amplifier 120 to an output side of the amplifier 120. Moreover, the first integrator 70 comprises a first and a second chopping circuit 123, 124. The first input 68 of the first integrator 70 is coupled via the first chopping circuit 123 to a first and a second input of the amplifier 120. Correspondingly, the second input 69 of the first integrator 70 is coupled via the first chopping circuit 123 to the first and the second input of the amplifier 120. The first input may be an inverting input and the second input may be a non-inverting input of the amplifier 120.

A first and a second output of the amplifier 120 is coupled via the second chopping circuit 124 to a first output 125 of the first integrator 70. Additionally, the first and the second output of the amplifier 120 is coupled via the second chopping circuit 124 to a second output 126 of the first integrator 70. The first output of the amplifier 120 may be a non-inverting output of the amplifier 120 and the second output of the amplifier 120 may be an inverting output of the amplifier 120.

The first integrating capacitor 121 is coupled between the first input 68 of the first integrator 70 and the first output 125 of the first integrator 70. Correspondingly, the second integrating capacitor 122 is coupled between the second input 69 of the first integrator 70 and the second output 126 of the first integrator 70. The first and the second integrating capacitor 121, 122 have the capacitance values CINT1P, CINT1N.

The second integrator 76 is implemented as a differential integrator. The second integrator 76 is coupled on its input side to the first and second output 125, 126 of the first integrator 70. The converter 13 comprises a sampling stage 129 coupling the output side of the first integrator 70 to the input side of the second integrator 76. The sampling stage 120 may realize the third buffer 77 (shown in FIG. 3A). The quantizer 71 is coupled on its input side to the output side of the second integrator 76. A threshold of the quantizer 71 may be generated internally in the quantizer 71.

Moreover, the converter 13 comprises a flip-flop 130 having an input connected to the output of the quantizer 71. The input of the flip-flop 130 is realized as a D-input. An output of the flip-flop 130 is coupled to the output 14 of the converter 13. The output of the flip-flop 130 is realized as a Q-output. The flip-flop 130 comprises a clock input. The filter 79 (shown in FIG. 3A) may couple the output of the flip-flop 130 to the output 14 of the converter 13.

The second integrator 76 comprises a further amplifier 141 and a third and a fourth integrating capacitor 142, 143. The third and the fourth integrating capacitor 142, 143 have the capacitance values CINT2P, CINT2N. The first integrating capacitor 142 couples a first input 144 of the further amplifier 141 to a first output 146 of the further amplifier 141. The fourth integrating capacitor 143 couples a second input 145 of the amplifier 141 to a second output 147 of the further amplifier 141. The first input 144 may be realized as an inverting input and the second input 145 may be realized as a non-inverting input of the amplifier 141. The first output 146 of the further amplifier 141 may be implemented as a non-inverting output and the second output 147 of the further amplifier 141 may be implemented as an inverting output. The first and the second output 146, 147 of the further amplifier 141 form a first and a second output of the second integrator 76 and are coupled to a first and a second input of the quantizer 71.

The sampling stage 129 comprises a first and a second sampling capacitor 151, 152 (which may have e.g. capacitances CsampleA, CsampleB). Moreover, the sampling stage 129 comprises a first to an eighth sampling switch 153 to 160. A first electrode of the first sampling capacitor 151 is coupled via the first sampling switch 153 to the first output 125 of the first integrator 70 and via the second sampling switch 154 to the common mode terminal 90. The second electrode of the first sampling capacitor 151 is coupled via the third sampling switch 155 and a first output of the sampling stage 129 to the first input 144 of the further amplifier 141. The second electrode of the first sampling capacitor 151 is coupled via the fourth sampling switch 156 to the common mode terminal 90.

A first electrode of the second sampling capacitor 152 is coupled via the fifth sampling switch 157 to the second output 126 of the first integrator 70 and via the sixth sampling switch 158 to the common mode terminal 90. A second electrode of the second sampling capacitor 152 is coupled via the seventh sampling switch 159 and a second output of the sampling stage 129 to the second input 145 of the further amplifier 141. The second electrode of the second sampling capacitor 152 is coupled via the eighth sampling switch 160 to the common mode terminal 90.

Additionally, the converter comprises a first and a second feedback capacitor 170, 171 (which may have e.g. capacitances CfeedbackA, CfeedbackB) and a first to a twelfth feedback switch 172 to 183. A first electrode of the first feedback capacitor 170 is coupled via the first feedback switch 172 to the first input 68 of the first integrator 70 and via the second feedback switch 173 to the common mode terminal 90. A second electrode of the first feedback capacitor 170 is coupled via the third feedback switch 174 to the reference potential terminal 103, via the fourth feedback switch 175 to the output 33 of the generator 32, via the fifth feedback switch 176 to the reference potential terminal 103 and via the sixth feedback switch 177 to the output 33 of the generator 32.

Additionally, a first electrode of the second feedback capacitor 171 is coupled via the seventh feedback switch 178 to the second input 69 of the first integrator 70 and via the eighth feedback switch 179 to the common mode terminal 90. A second electrode of the second feedback capacitor 171 is coupled via the ninth feedback switch 180 to the reference potential terminal 103, via the tenth feedback switch 181 to the output 33 of the generator 32, via the eleventh feedback switch 182 to the reference potential terminal 103 and via the twelfth feedback switch 183 to the output 33 of the generator 32.

Furthermore, the converter 13 comprises a third and a fourth feedback capacitor 190, 191 (which both may have the capacitance CFB2A) and further feedback switches 192 to 201. A first electrode of the third feedback capacitor 190 is coupled via a further first feedback switch 192 to the first input 144 of the second integrator 76 and via a further second feedback switch 193 to the common mode terminal 90. A second electrode of the third feedback capacitor 190 is coupled via a further third feedback switch 194 to the common mode terminal 90, via a further fourth feedback switch 195 to the reference potential terminal 103 and via a further fifth feedback switch 196 to the output 33 of the generator 32.

A first electrode of the fourth feedback capacitor 191 is coupled via a further sixth feedback switch 197 to the second input 145 of the second integrator 76 and via a further seventh feedback switch 198 to the common mode terminal 90. A second electrode of the fourth feedback capacitor 191 is coupled via a further eighth feedback switch 199 to the common mode terminal 90, via a further ninth feedback switch 200 to the reference potential terminal 103 and via a further tenth feedback switch 201 to the output 33 of the generator 32.

At the common mode terminal 90, a common mode voltage VCM is provided. The switches of the converter 13 are controlled by a first phase signal P1, a second phase signal P2, a further first phase signal P1A, an additional first phase signal P1B, a further second phase signal P2A and an additional second phase signal P2B as shown in FIG. 3B. The first phase signal P1 is also applied to the clock input of the flip-flop 130. A phase generator 131 generates the phase signals P1, P2, P1A, P1B, P2A, P2B. In FIG. 3B and other figures, the control signals are indicated at the control inputs of the switches. An input of the phase generator 131 receives a phase control signal SPC and may be connected to the output of the quantizer 71, the output of the flip-flop 130 and/or the digital circuit 20. A clock circuit 132 may be connected to the phase generator 131.

The sensor arrangement 10 may comprise at least one of these circuit blocks:
Two pressure sensitive membranes 12, 30.
Additional pairs of pressure sensitive or insensitive membranes.
A certain number of pairs of fixed capacitors 66, 67, 142, 143, 151, 152, 170, 171, 121, 122, 142, 143, 190, 191.
A sigma-delta modulator 13.
A digital low-pass filter 79.
A programmable voltage generator 32.
A phase generator 131.

The purpose of this circuit is to convert the capacitance value CA into a digital number SP. The sigma-delta modulator 13 works in a fully differential way; voltage variations on the positive branches correspond to variations of opposite sign on the negative branches; operation is symmetrical with respect to the common mode voltage VCM. The phase generator 131 generates two non-overlapping phases P1, P2 at the same frequency. The ΣΔ modulator input is driven by two identical capacitors 12, 30 sensitive to pressure P that generate directly the differential voltages with no common voltage signal. A common mode signal can originate if there is a mismatch between the two sensors 12, 30; in this case the differential architecture rejects any common mode signal.

The circuit in FIG. 3B realizes the functions indicated in the high level equivalent of FIG. 3A, which is a second-order sigma-delta analog to digital converter 13 (analog to digital converter is abbreviated ADC). Being the input capacitance always positive and the input range of the ADC bipolar, it may be necessary to shift the capacitance by a fixed amount in order to adapt the ADC range to the sensor range. This is done by the offset branches using the first and the second offset capacitor 66, 67, which inject a charge with opposite sign with respect to the main input capacitors 12, 30; therefore, the apparent capacitance to be converted is CA-Coffset or CA-CoffsetA. Coffset itself is controllable by adding additional capacitors in parallel, as shown e.g. in FIG. 3F; this allows to further adapt the input range of the CDC 13 to the sensing capacitors value. The advantage is that due to subtraction of the offset capacitance the noise figure can be reduced because this capacitance is not contributing to the noise anymore.

The comparator output is sampled at the main clock frequency, and its sampled value determines the sign of the charge injected by the feedback branches using the feedback capacitors 170, 171, 190, 191 by enabling either the phase signals P1A/P2A or the phase signals P1B/P2B. The sign is chosen in such a way that the overall loop is stable.

When in operation, the input capacitors 12, 30 are charged to the reference voltage VREF during one phase and discharged during the next one, so that an average voltage greater than zero is developed across their terminals. The programmable generator 32 can then be used to measure the variation of Capacitance against Voltage (C against V), which gives information about various parameters of the pressure-sensitive membrane 43.

In an alternative embodiment, not shown in FIG. 3B but in FIGS. 1B, 1C and 3E, the arrangement 10 comprises the switching circuit 15. Adding a mux 15 in front of the CDC block 13 gives the possibility of measuring additional pairs of sensors or pairs of fixed capacitors, e.g. the capacitors 36 to 39. Fixed capacitors (abbreviated fixed caps) can be used to test the CDC 13. Cross-connect switches in the mux 15 allow different combinations of capacitors measured, for example sensor1+fixed cap and sensor2+fixed cap (e.g. the sensor 12 and the third capacitor 36 and then the further sensor 30 and the third capacitor 36). Being the fixed cap exactly the same, the comparison between the two measurements above can give information about the mismatch between sensor1 and sensor2 (that are the sensor 12 and the further sensor 30).

Other topologies of sigma-delta modulator are possible, such as higher order, with additional stages after the second, or cascade, with additional loops attached to the primary one.

The capacitance-to-digital converter 13 is based on a third-order delta-sigma differential ADC, connected to the pressure membranes 12, 30, optionally through an analog switch matrix 15. The offset and the capacitance range of the C2D 13 needs to be matched to the capacitance variation over the pressure range for a certain membrane size. The offset capacitor Coff or CoffsetA or CoffsetB is tuned to the middle of the expected range (e.g. 1.6 pF for the example used here). The reference capacitor is chosen such that the required capacitance range of the pressure sensor 12 can be covered completely including the process spread. One could state that the size of the reference capacitor is half the desired dynamic range. A series of reference caps e.g. from 0.5 pF up to 2.4 pF can be combined with offset caps of 1.0 pF+0.1/ . . . /2.2 pF to cover all possible capacitance ranges of the membranes.

Figure 3C:
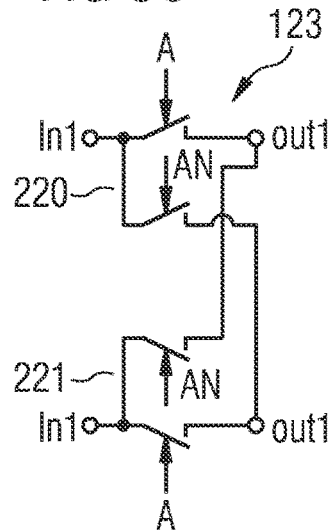
Figure 3D:
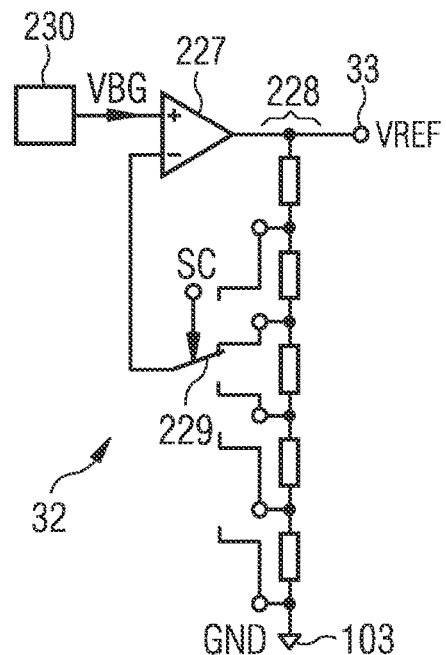
Figure 3E:
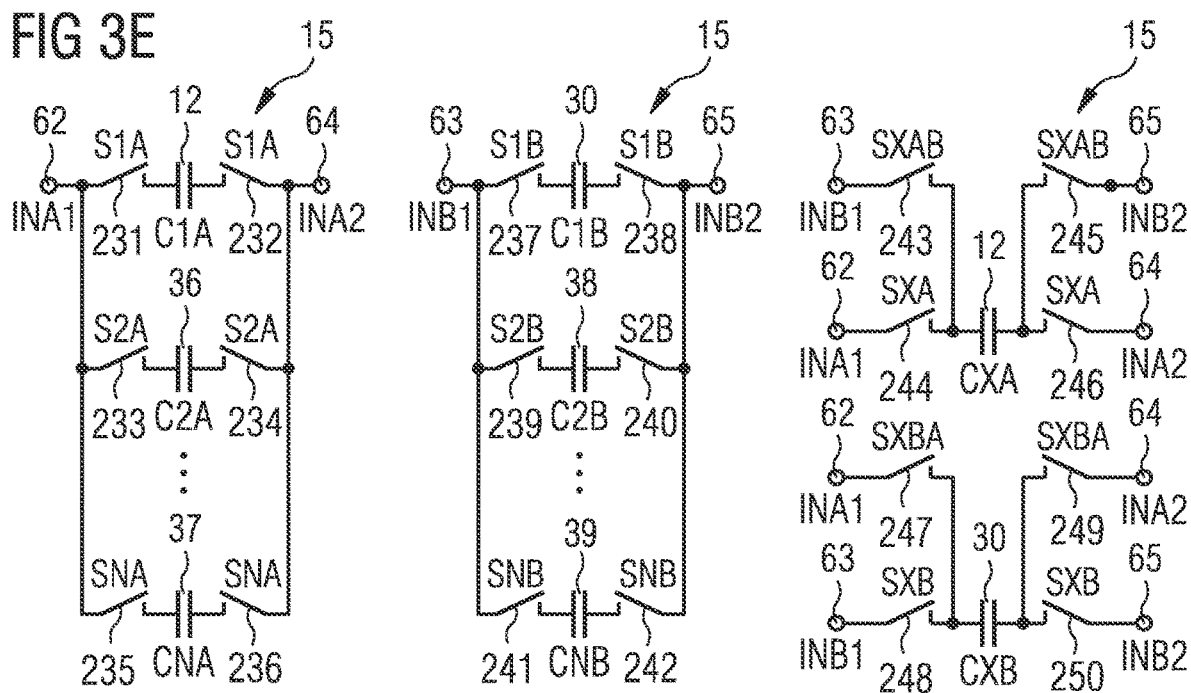
Figure 3F:
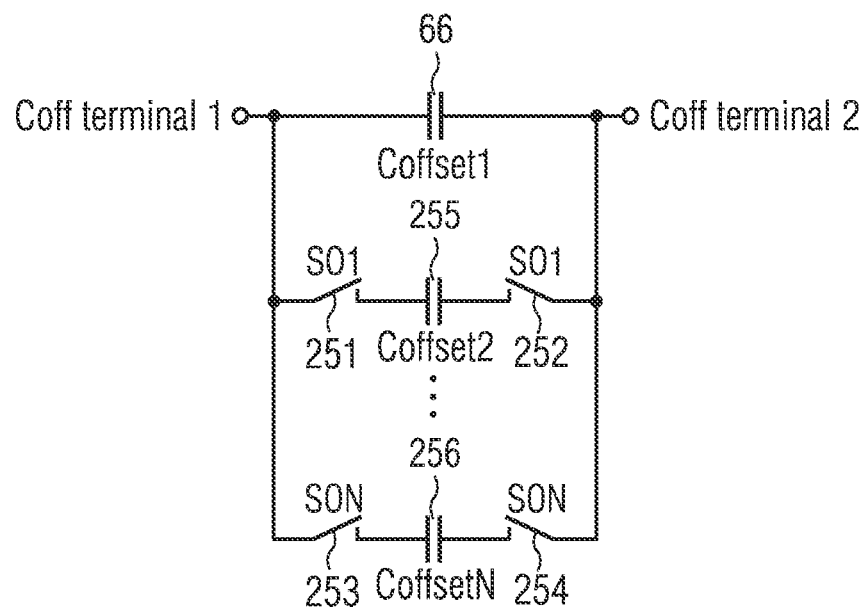
Figure 3G:
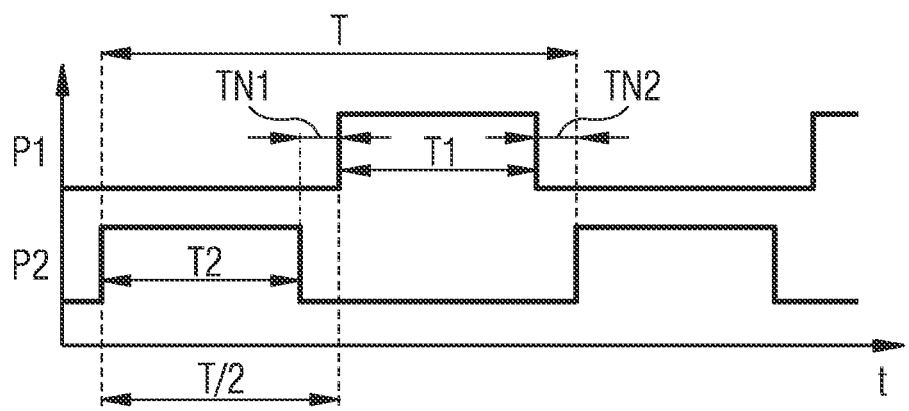
Figure 3H:
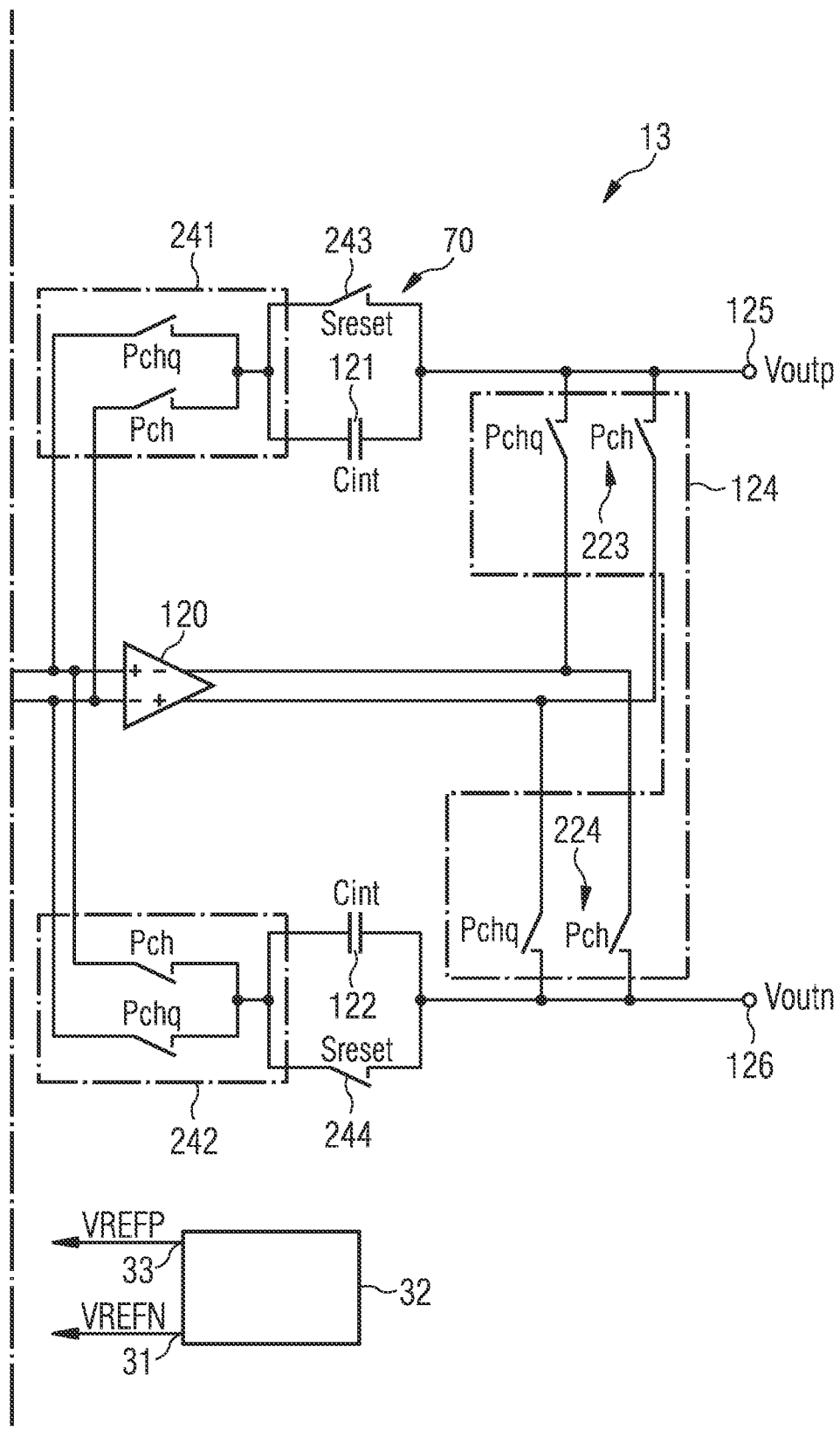

FIG. 3C shows a detail of the converter 13 shown in FIG. 3B or 3H, namely an opam chop switch. In FIG. 3C, an example of the first and the second chopping circuit 123, 124 is shown. The first chopping circuit 123 comprises a first and a second changeover switch 220, 221. The first changeover switch 220 couples a first input of the first chopping circuit 123 to a first and a second output of the first chopping circuit 123. Correspondingly, the second changeover switch 222 couples a second input of the first chopping circuit 123 to the first and the second output of the chopping circuit 123. The first and the second changeover switch 220, 221 are controlled by a first and a second chopper signal A, AN. The second chopper signal AN may be an inverted signal with respect to the first chopper signal A.

FIG. 3D shows an example of the reference voltage generator 32 that is a further development of the above-shown examples of the reference voltage generator. The generator 32 comprises an amplifier 227 having an output connected to the output 33 of the generator 32. Moreover, the generator 32 comprises a resistive voltage divider 228 coupling the output 33 of the generator 32 to the reference potential terminal 103. The resistive voltage divider 228 may comprise at least two resistors. In the example shown in FIG. 3D, the number of resistors is five. Moreover, the generator 33 comprises a changeover switch 229 having inputs connected to nodes between the resistors of the resistive voltage divider 228. The amplifier 227 comprises a first and a second input. The first input of the amplifier 227 may be a non-inverting input and the second input of the amplifier 227 may be an inverting input. An output of the changeover switch 229 is connected to the second input of the amplifier 227. A bandgap voltage VBG is provided to the first input of the amplifier 227.

The arrangement 10 may comprise a bandgap voltage reference generator 230 having an output connected to the first input of the amplifier 227. The bandgap voltage reference generator 230 generates the bandgap voltage VBG. The control signal SC controls the changeover switch 229. Advantageously, the generator 32 provides different values of the reference voltage VREF at the output 33 as a function of the control signal SC. The different values of the reference voltage VREF have the same sign with respect to the reference potential GND and different amounts.

FIG. 3E shows further details of the arrangement 10 which is a further development of the above-shown embodiments, namely a CDC input mux. The arrangement 10 comprises the first and the third capacitor 34, 36 (having capacitance values C2A, CNA) which can be coupled in parallel to the sensor 12 (having a capacitance value C1A). The coupling of the sensor 12 and of the first and the third capacitor 34, 36 is provided by the switching circuit 15 that includes switches 231 to 236 controlled by signals S1A, S2A, SNA. As indicated by the dots, there may be further capacitors connected in parallel to the sensor 12. Correspondingly, the arrangement 10 may comprise the second and the fourth capacitor 35, 37 (having capacitance values C2B, CNB) that are coupled in parallel to the further sensor 30 (having a capacitance value C1B). The coupling is achieved by the switching circuit 15 that includes switches 237 to 242 that are controlled by the signals S1B, S2B, SNB. There may be further capacitors connected in parallel to the further sensor 30 as indicated by the dots.

In one example as shown in the right part of FIG. 3E, the position of the sensor 12 (having a capacitance value CXA) and of the further sensor 30 (having a capacitance value CXB) may be interchanged using switches 243 to 250. Thus, the sensor 12 may be connected to the first input 62 of the converter 13 in a first operation phase and to the second input 63 of the converter 13 in a second operation phase by the switching circuit 15. Correspondingly, the further sensor 30 is connected to the second input 63 of the converter 13 in the first operation phase and to the first input 62 of the converter 13 in the second operation phase by the switching circuit 15. Parallel operation is used in order to obtain different values for the sensors 12, 30, the offset capacitors 66, 67, the reference capacitors and other capacitor, but the same arrangement works as switch: it may connect the different sensor capacitors 12, 30 separately (during different measurements).

FIG. 3F shows a further example of details of the converter 13, namely an implementation of a variable offset capacitance. One or two capacitors 255, 256 are coupled to the first offset capacitor 66 (having a capacitance value Coffset1) in a parallel circuit using switches 251 to 254. Thus, a further capacitor 255 (having a capacitance value Coffset2) may be coupled in parallel to the first offset capacitor 66 by two switches 251, 252. An additional capacitor 256 (having a capacitance value CoffsetN) may be coupled in parallel to the first offset capacitor 66 by further switches 253, 254. Thus, a first offset capacitance is formed by the parallel circuit of the first offset capacitor 66, the further capacitor 255 and the additional capacitor 256 depending on the state of the switches 251 to 254. The switches 251, 252 are controlled by a signal SO1 and the further switches 253, 254 are controlled by a signal SON. The second offset capacitor 67 may be coupled to further capacitors similar as shown in FIG. 3F. The converter 13 includes the switches 251-254.

FIG. 3G shows an example of the first and second phase signal P1, P2 of the arrangement 10 shown above. The first and the second phase signal P1, P2 have a pulse form. The first and the second phase signal P1, P2 is cyclically repeated. A pulse of the first phase signal P1 is between two pulses of the second phase signal P2 (and vice versa with the exception of a first pulse). A pulse of the first phase signal P1 has a first duration T1 and a pulse of the second phase signal P2 has a second duration T2. A first non-overlap time with a duration TN1 is between a pulse of the second phase signal P2 and the following pulse of the first phase signal P1. A second non-overlap time with a duration TN2 is between a pulse of the first phase signal P1 and the following pulse of the second phase signal P2. The non-overlapping phases increase the performance of the capacitance-to-digital conversion. Thus, the cycle time T can be calculated according to the following equation:

$$T=T2+TN1+T1+TN2.$$

During the pulse of the first phase signal P1, the reference voltage VREF is applied to the second electrode 61 of the sensor 12 and the common mode voltage VCM is applied to the first electrode 60 of the sensor 12. Thus, a voltage VREF-VCM is applied between the first and the second electrode 60, 61 of the sensor 12. During the pulse of the second phase signal P2, the reference voltage VREF is applied to the second electrode 61' of the further sensor 30 and the first electrode 60' of the further sensor 30 is connected to the second input 69 of the first integrator 70.

A pulse of the further first phase signal P1A can be at the same time as a pulse of the first phase signal P1 or is skipped depending on the phase control signal SPC at the input of the phase generator 131. A pulse of the additional first phase signal P1B can be at the same time as a pulse of the first phase signal P1 or is skipped depending on the phase control signal SPC. Only one of the further first phase signal P1A and the additional first phase signal P1B can have a pulse at the same time. Similarly, pulses of the phase signals P2A, P2B are at the same time as pulses of the second phase signal P2 or are skipped.

FIG. 3H shows a further example of the arrangement 10 which is a further development of the embodiments shown above. In FIG. 3H, an example of the sensor arrangement 10 with C2D convertor design with four terminals 62-65 (SENSE1, BASE1, SENSE2 and BASE2) is illustrated. The first chopper circuit 123 includes the first and the second changeover switches 220, 221 which couple the first and the second input 68, 69 of the first integrator 70 to the input side of the amplifier 120. Moreover, a third changeover switch 223 of the second chopper circuit 124 couples the first and the second output of the amplifier 120 to the first output 125 of the first integrator 70. A fourth changeover switch 224 of the second chopper circuit 124 couples the first and the second output of the amplifier 120 to the second output 126 of the first integrator 70. The first and the second chopper circuit 123, 124 are controlled by a first and a second chopper signal Pch, Pchq (which may be equal to the signals A, AN).

Contrary to the example shown in FIG. 3B, the first and the second integrating capacitor 121, 122 are coupled between the input side of the amplifier 120 and the output side of the first integrator 70. A first changeover switch 241 of the first integrator 70 couples a first electrode of the first integrating capacitor 121 to the first and to the second input of the amplifier 120. A second changeover switch 242 of the first integrator 70 couples a first electrode of the second integrating capacitor 122 to the first and the second input of the amplifier 120. The first input may be non-inverting input and the second input may be an inverting input of the amplifier 120. A second electrode of the first integrating capacitor 121 is connected to the first output 125 of the first integrator 70. A second electrode of the second integrating capacitor 122 is connected to the second output 126 of the first integrator 70.

A first reset switch 243 of the first integrator 70 couples the first electrode to the second electrode of the first integrating capacitor 121. Correspondingly, a second reset switch 244 of the first integrator 70 couples the first electrode to the second electrode of the second integrating capacitor 122. The first and the second reset switch 243, 244 are controlled by a reset signal Sreset.

The arrangement 10 comprises the sensor 12 arranged between the third input 64 (named BASE1) and the first input 62 (named SENSE1) and the further sensor 30 arranged between the fourth input 65 (named BASE2) and the second input 63 (named SENSE2). Since the sensor 12 and the further sensor 30 have approximately the same capacitance value, a capacitance Cs is indicated at both sensors 12, 30.

At an additional reference terminal 239, an additional reference potential AGND is tapped. The additional reference potential AGND may have the value of the commode voltage VCM shown in FIG. 3B or of the reference potential GND. The second electrode 61 of the sensor 12 is coupled via the third and the fourth switch 93, 94 to a positive reference voltage VREFP and to a negative reference voltage VREFN. The negative reference voltage VREFN is provided at a further output 31 of the reference voltage generator 32. The positive reference voltage VREFP may have the value of the reference voltage VREF. The negative reference voltage VREFN may have the value of the reference potential GND as shown in FIG. 3B or may have the same amount such as the reference voltage VREF but an opposite sign in respect to the reference potential GND. Also the second electrode 61' of the further sensor 30 is coupled to the positive and to the negative reference voltage VREFP, VREFN via the seventh and the eighth switch 97, 98.

The first and the second offset capacitor 66, 67 may have an equal capacitance value Cm. The second electrode of the first and the second offset capacitor 66, 67 are coupled via switches 101, 102, 106, 107 to the positive and to the negative reference voltage VREFP, VREFN. The first and the second feedback capacitors 170, 171 may have an equal capacitance value Cdac. The second electrodes of the first and the second feedback capacitors 170, 171 are coupled via switches 174 to 176, 180 to 182 to the positive reference voltage VREFP, the negative reference voltage VREFN and the additional reference potential AGND.

The first and the second output 125, 126 of the first integrator 70 may be directly and permanently connected to the two inputs of the quantizer 71. Alternatively, the first and the second output 125, 126 of the first integrator 70 may be coupled via the sampling stage 129 and the second integrator 76 to the two inputs of the quantizer 71. The operation of the arrangement 10 shown in FIG. 3H may correspond to the operation of the arrangement 10 shown in FIGS. 3A to 3G.

The patent application US 2015/0295587 A1 is incorporated by reference (e.g. for explaining details of the examples of the converter 13 discussed above).

A chip design may be based on the differential four terminal capacitance to digital convertor design. Two matched pressure sensitive membranes 43 are connected to the capacitance to digital convertor (see FIG. 3H). The reference voltage or voltages VREFP, VREFN, VREF can be tuned in order to electrostatically attract the membranes 43 to the bottom electrode 42 thereby increasing the capacitance Cs. The C-V behavior allows to determine the membrane pressure sensitivity.

Optional or possible differences and improvements are listed below:
Differential sensor.
Two membranes versus one: Doubles the signal dynamic range.
Improves the linearity of the CDC 13 (full-differential instead of pseudo-differential; non-linearity is calibrated together with the sensor 12).
Common mode suppression: Improves robustness against EMC disturbances.
Smaller sensor capacitance and C-range: 2× lower noise.
Higher reference voltage VREF (e.g. 1.2V to 1.65V): e.g. 33% noise reduction
Higher clock frequency (e.g. 66 kHz to 132 kHz): Leads to lower current and noise charge at given speed.
No parasitic to sensor guard.
No need for shield driver leads to power savings.
Correlated double sampling reduces the influence of reference and supply noise.
Capacitors Cref and Coff (e.g. the capacitors 34 to 39, 66, 67) are metal-isolator-metal capacitors, shorted MIM caps.

Figure 4A:
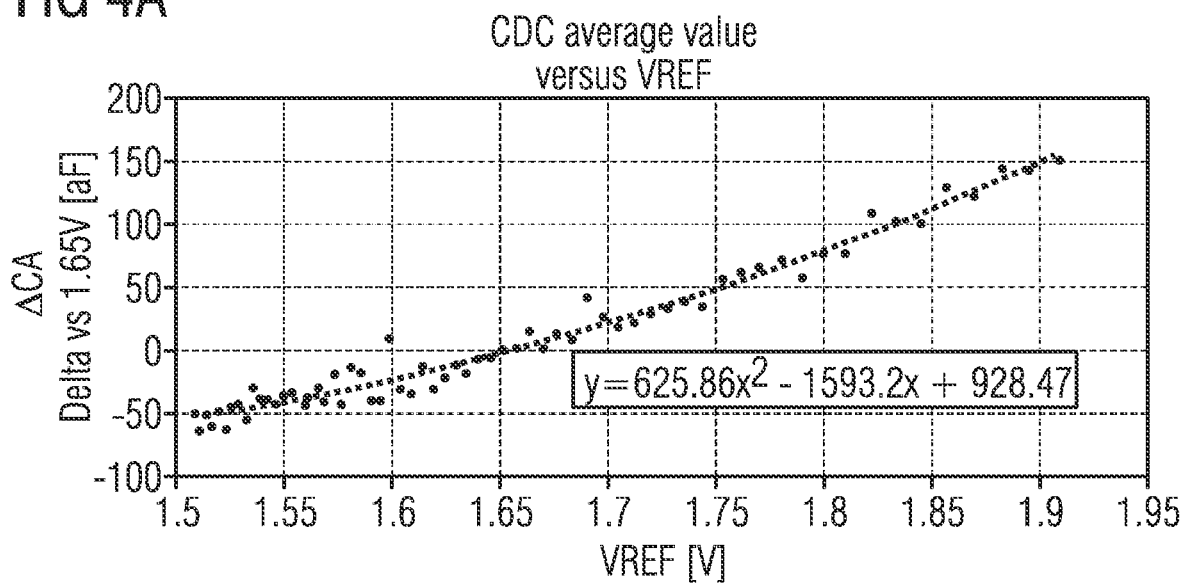
FIGS. 4A to 4F show examples of characteristics of a sensor arrangement.

FIGS. 4A to 4F show examples of characteristics of the arrangement 10 of one of the embodiments described above. In FIG. 4A, the capacitance CA of the sensor 12 is shown as a function of the reference voltage VREF. The capacitance CA is rising with a rising value of the reference voltage VREF. By the rising reference voltage VREF the attracting force between the first and the second electrode 60, 61 of the sensor 12 increases, resulting in an increase of the capacitance CA. The capacitance change is shown with respect to the capacitance measured at VREF=1.65V as function of the reference voltage VREF. The characteristic parabolic capacitance to voltage behavior can be clearly perceived. A fit of the C-V data points yields the parameter A0 which is a measure of the membrane compliance. As shown in FIG. 4A, the capacitance CA depends on the reference voltage VREF as:

$$CA=C0+B0 \cdot VREF+A0 \cdot VREF^2.$$

C0, B0, A0 are parameters. If the parameter B0 is to be determined, a third point is required for fitting the curve. Alternatively, a fit of the C-V data points can also be performed using the equation:

$$CA=C0+A0 \cdot VREF^2.$$

Figure 4B:
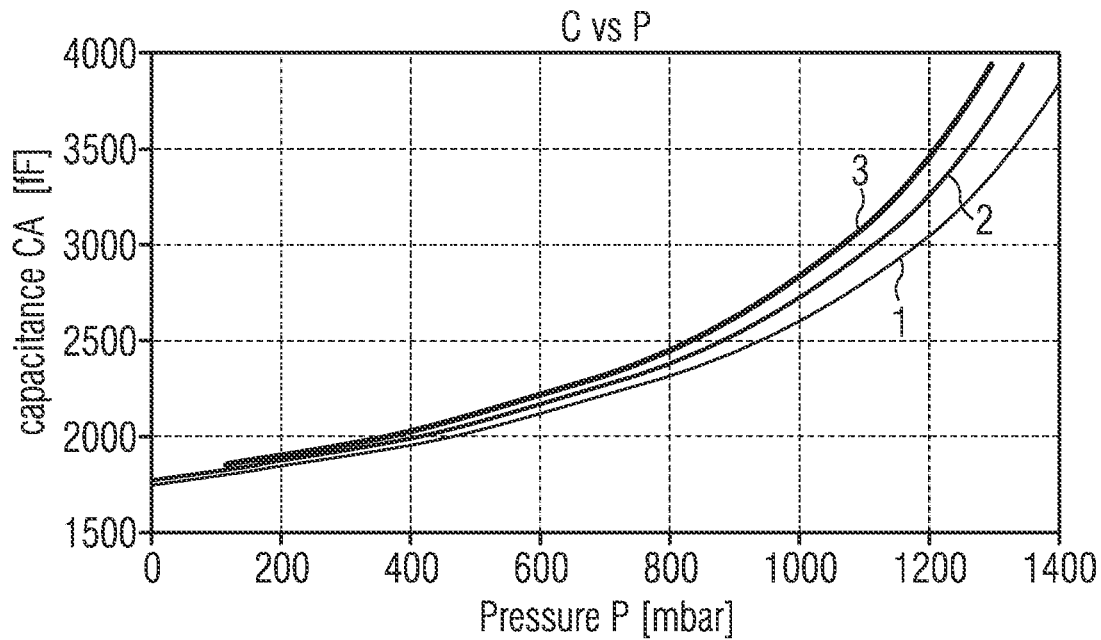
Figure 4C:
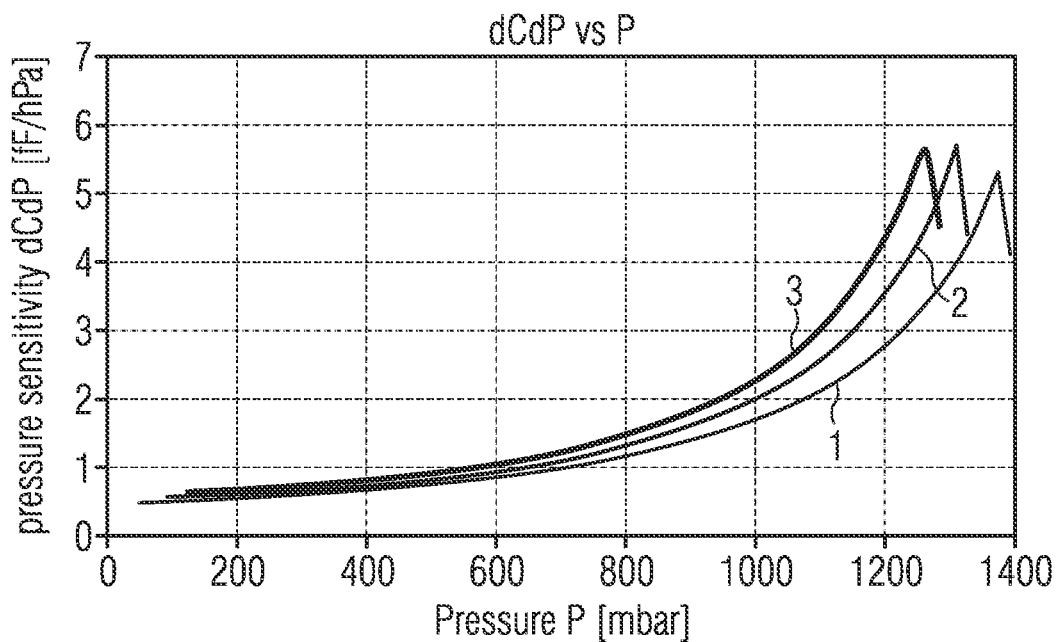

In FIGS. 4B and 4C, the capacitance CA and the pressure sensitivity dCdP of the pressure sensor 12 is shown as a function of the applied pressure P.

Figure 4D:
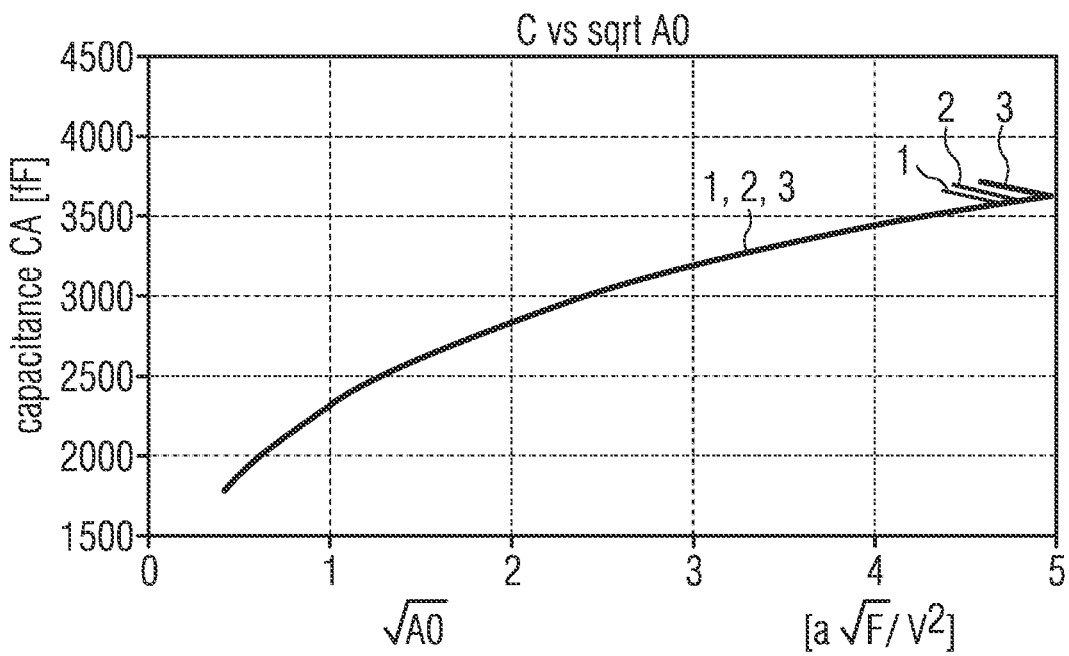
Figure 4E:
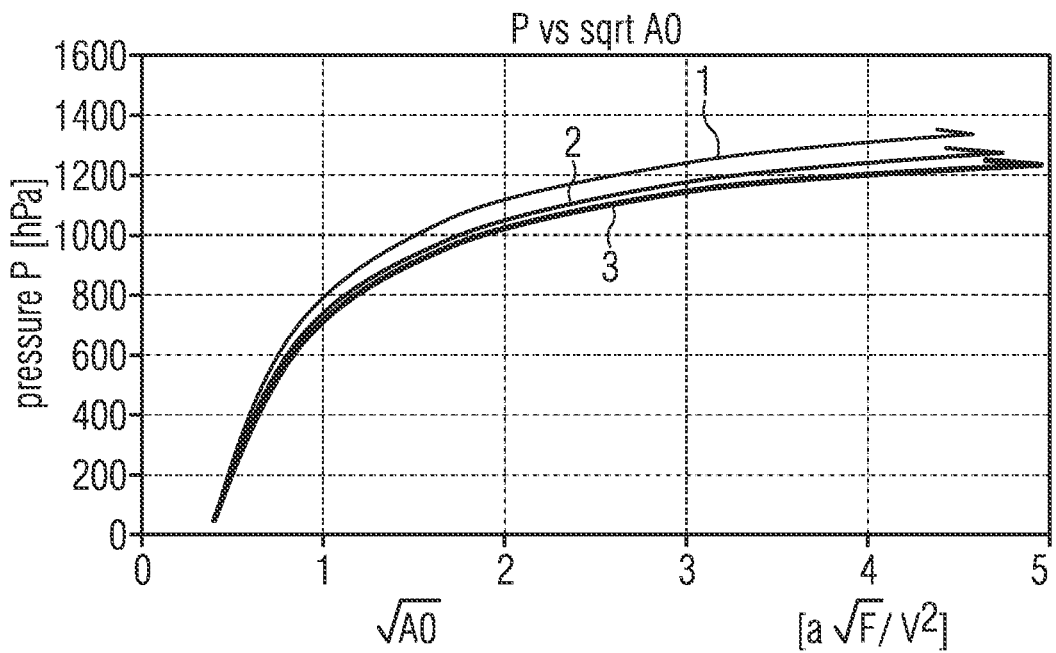

FIG. 4D shows the capacitance CA of the sensor 12 versus square root of the parameter A0 after different anneal conditions. FIG. 4E shows the pressure P versus square root of the parameter A0 after different anneal conditions.

Figure 4F:
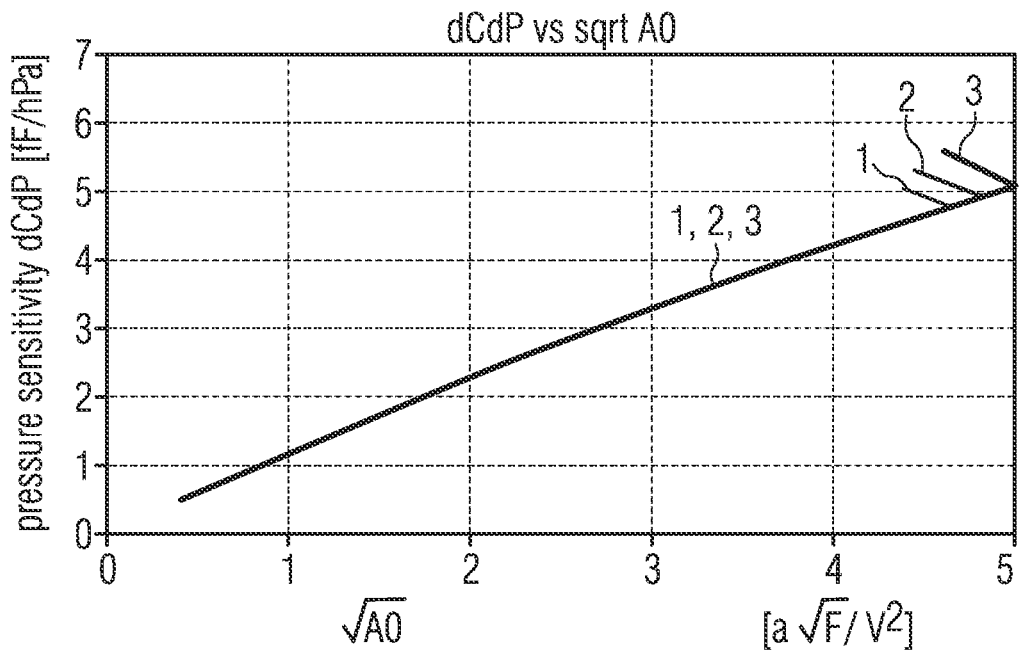

FIG. 4F shows the pressure sensitivity versus square root of the parameter A0 behavior after different anneal conditions. An almost linear behavior is found between the pressure sensitivity (dCdP) and the square root of A0 as is shown in FIG. 4F. If this relation is known, the transducer capacitance CA can be correctly converted into the right pressure output using the change in pressure sensitivity.

In FIGS. 4B to 4F, the characteristic measured for a first example of the sensor 12 is marked with 1, the characteristic for a second example of the sensor 12 is marked with 2, and the characteristic for a third example of the sensor 12 is marked with 3.

The sensor arrangement 10 with the pressure sensor 12 may realize: Sensor possible good die selection during e-sort (i.e. right sensitivity); checking if the membrane 43 is properly released during e-sort; sensor calibration/recalibration in the field; sensor self-test; determining if and how much sensor properties have changed during assembly and over lifetime; and return-merchandise-authorization support, abbreviated RMA support.

Advantages of the sensor arrangement 10 may be: Reduce assembly cost; reduce test cost (less calibration points); improve accuracy over lifetime; enable possible good die selection (e.g. for a pressure sensor microphone combination); yield tracking and yield improvement studies before assembly; and evaluate impact of packaging on sensor shifts: give direct feedback on stress decoupling effect.

The sensor arrangement 10 may comprise the following features:
1) The capacitive pressure sensor 12 is integrated on top of CMOS with embedded differential capacitive to digital converter 13 with four terminals 62 to 65 and two pressure sensitive membranes;
2) Employing variable voltage reference VREF to allow for a capacitance-voltage measurement and extraction of parameter A0 on two matched pressure sensitive elements;
3) Storing the parameter A0 as function of pressure P and temperature on chip, e.g. in the memory 21;
4) Correction for P output changes over lifetime based on the A0-pressure and A0-temperature changes; and
5) A switch matrix 15 to connect different membrane/capacitor configurations to determine mismatch.

The reference voltage VREF may be realized as a bias voltage or a source voltage VCM provided by a bias circuit. The reference voltage generator 32 may be realized as a programmable VREF generator or the bias circuit.

The converter 13 may be named convertor and vice versa.

A converter 13 may be realized as a capacitance to digital converter (shorted CDC, C2D or CDC converter). An analog-to-digital converter (shorted ADC) may be realized as a CDC and vice versa.

The pressure sensor 12 may be named sensor1 and the further pressure sensor 30 may be named sensor2.

FIG. 5A shows a further example of the arrangement 10, which is a further development of the above shown examples. FIG. 5A is a top view on the first surface of the semiconductor body 11 of the arrangement 10. The semiconductor body 11 is rectangular with a first length A and a second length B. The first length A is e.g. different from the second length B. The sensor 12 and the further sensor 30 both have a rectangular membrane 43, 43'. Both membranes 43, 43' have an identical first side length L1 and an identical second side length L2. The second side length L2 is larger than the first side length L1. The second side length L2 may be larger than twice the first side length L1. Alternatively, the second side length L2 may be larger than three times the first side length L1. The longer side of the membrane 43 of the sensor 12 is parallel to the longer side of the membrane 43' of the further sensor 30.

Moreover, the arrangement 10 comprises several bond pads 260 to 265 which may be arranged at only one border of the first surface of the semiconductor body 11. The area on the first surface of the semiconductor body 11 that is not used for the realization of the membranes 43, 43' of the sensor 12 and of the further sensor 30 comprises circuit parts such as the converter 13, the generator 32, the switching circuit 15 and the digital circuit 20.

FIG. 5B shows a cross section and a top view of the arrangement 10. Details of the sensor 12 and of the further sensor 30 are shown. The sensor 12 and the further sensor 30 are realized on the same surface of the semiconductor body 11. The two sensors 12, 30 are arranged side by side. The cross section shown in FIG. 5B is a further development of the cross section shown in FIG. 2 of the sensor 12. The sensor 12 and the further sensor 30 are realized by the same fabrication process and use the same sequence of layers. The size of the membranes 43, 43' and other structures of the sensor 12 and of the further sensor 30 may be equal. The values of the gap between the top electrode 41, 41' and the bottom electrode 42, 42' of the sensor 12 and of the further sensor 30 are equal. The bond pad 59 and a shielding electrode 48 that is below the bottom electrode 42 may be realized by the first metallization layer 52. A passivation layer 47 is between the shielding electrode 48 and the bottom electrode 42. The dielectric layer 44 performs a seal of the membrane 43.

In the top view on the left side, the bottom electrode 42' of the further sensor 30 is shown. The top electrode 41' covers not only the area of the bottom electrode 42' but also a frame around the bottom electrode 42' having a width TW. Thus, the area of the top electrode 41' is larger than the area of the bottom electrode 42'.

In the top view on the right side, the membrane 43 of the sensor 12 is shown. The membrane 43 has the cavity 45 underneath. The cavity 45 is surrounded by the via 54. The via 54 is realized as anchors. The anchors are formed by stripes (or lines). The anchors may be W anchors. The material between the stripes is e.g. sacrificial oxide.

In the following text, further aspects of the present disclosure are specified. The individual aspects are enumerated in order to facilitate the reference to features of other aspects.

Example 1: Sensor arrangement comprising a pressure sensor 12 that is realized as capacitive pressure sensor and a capacitance-to-digital converter 13 coupled to the pressure sensor.

Example 2. Sensor arrangement according to example 1, wherein the sensor arrangement 10 is realized as a semiconductor body 11, and wherein the semiconductor body 11 comprises the pressure sensor 12 and the capacitance-to-digital converter 13.

Example 3. Sensor arrangement according to example 1 or 2, comprising a further pressure sensor 30 that is realized as a capacitive pressure sensor, wherein the capacitance-to-digital converter 13 is coupled to the further pressure sensor 30.

Example 4. Sensor arrangement according to example 3, wherein the semiconductor body 11 comprises the further pressure sensor 30.

Example 5. Sensor arrangement according to one of examples 1 to 4, wherein the capacitance-to-digital converter 13 is implemented as a delta-sigma analog-to-digital converter.

Example 6. Sensor arrangement according to one of examples 1 to 5, wherein the capacitance-to-digital converter 13 is implemented as a delta-sigma differential analog-to-digital converter.

Example 7. Sensor arrangement according to one of examples 1 to 6, wherein a first and a second terminal of the capacitance-to-digital converter 13 is coupled to a first and a second electrode 60, 61 of the pressure sensor 12 and/or a third and a fourth terminal of the capacitance-to-digital converter 13 is coupled to a third and a fourth electrode of the further pressure sensor 12.

Example 8. Sensor arrangement according to one of example 1 to 7, wherein the capacitance-to-digital converter 13 is configured to measure a capacitance of at least one sensor of a group consisting of the pressure sensor 12 and the further pressure sensor 30 as a function of a reference voltage, a bias voltage or a source voltage VCM provided to the sensor.

Example 9. Sensor arrangement according to example 8, wherein the reference voltage, the bias voltage or the source voltage VCM is a DC voltage.

Example 10. Sensor arrangement according to example 8 or 9, wherein the reference voltage, the bias voltage or the source voltage VCM is applied between a first electrode of the pressure sensor and a second electrode of the pressure sensor at a point of time or in a phase.

Example 11. Sensor arrangement according to one of example 8 to 9, wherein the reference voltage, the bias voltage or the source voltage VCM is applied between a third electrode of the further pressure sensor and a fourth electrode of the further pressure sensor at a point of time or in a phase.

Example 12. Sensor arrangement according to one of example 1 to 11, comprising a reference voltage generator having a control input for receiving a control signal and an output for providing a reference voltage, wherein the reference voltage generator is configured to set a value of the reference voltage as a function of the control signal.

Example 13. Sensor arrangement according to example 12, wherein at least two different values of the reference voltage have the same sign and different amounts.

Example 14. Sensor arrangement according to example 12 or 13, wherein the output of the reference voltage generator is connected to an input of the capacitance-to-digital converter 13.

Example 15. Sensor arrangement according to one of examples 12 to 14, comprising a digital circuit 20 coupled to the capacitance-to-digital converter 13 and the reference voltage generator and a memory 21 connected to the digital circuit 20, wherein the digital circuit 20 is configured to generate the control signal.

Example 16. Sensor arrangement according to example 15, wherein in a test phase of operation, the digital circuit 20 is configured to control the reference voltage generator by the control signal such that the reference voltage generator consecutively generates at least two different values of the reference voltage, the capacitance-to-digital converter 13 is configured to generate at least two values of a digital signal depending on a capacitance value of at least one sensor of a group comprising the pressure sensor and the further pressure sensor, and the digital circuit 20 is configured to generate a parameter A0 and/or correction data depending on the at least two values of the digital signal.

Example 17. Sensor arrangement according to example 16, wherein the digital circuit 20 is configured to store the parameter A0 or correction data in the memory 21.

Example 18. Sensor arrangement according to example 15 or 16, wherein the digital circuit 20 is configured to generate the parameter A0 and/or the correction data as a function of at least one of a temperature of the sensor arrangement and a pressure.

Example 19. Sensor arrangement according to one of examples 15 to 18, wherein in a measurement phase of operation, the digital circuit 20 is configured to generate a digitized pressure signal SP depending on a digital signal SD provided by the capacitance-to-digital converter 13 and depending on the parameter A0 and/or the correction data stored in the memory 21.

Example 20. Sensor arrangement according to one of examples 15 to 19, wherein in a measurement phase of operation, the digital circuit 20 is configured to control the reference voltage generator by the control signal such that the reference voltage generator generates exactly one value of the reference voltage.

Example 21. Sensor arrangement according to one of examples 1 to 20, wherein the sensor arrangement 10 is configured to determine a mismatch such as a mismatch of a parameter A0 between the pressure sensor 12 and the further pressure sensor 30.

Example 22. Sensor arrangement according to one of examples 1 to 21, wherein the sensor arrangement 10 is free of a switching circuit 15 that couples the capacitance-to-digital converter 13 to the pressure sensor 12 and the further pressure sensor 30.

Example 23. Sensor arrangement according to one of examples 1 to 21, comprising a switching circuit 15 or a switch matrix that couples the capacitance-to-digital converter 13 to at least one capacitor of a group consisting of the pressure sensor 12, the further pressure sensor 30, a reference capacitor and a further reference capacitor or to at least two capacitors of said group.

Example 24. Sensor arrangement according to one of examples 3 to 23, wherein the pressure sensor 12 comprises a pressure sensitive membrane and the further pressure sensor 30 comprises a pressure sensitive further membrane, and wherein the membrane and the further membrane have the same size and the same thickness.

Example 25. Sensor arrangement according to one of examples 3 to 24, wherein the capacitance-to-digital converter 13 is electrically connected both to the pressure sensor 12 and the further pressure sensor 30 and is configured to generate a digital signal depending on a capacitance value of the pressure sensor 12 and a capacitance value of the further pressure sensor 30.

Example 26. Method of operating a sensor arrangement, comprising generating a digital signal depending on a capacitance value of a pressure sensor 12 and a capacitance value of a further pressure sensor 30 by a capacitance-to-digital converter 13, wherein the pressure sensor 12 and the further pressure sensor 30 are both realized as capacitive pressure sensors, and wherein the capacitance-to-digital converter 13 is electrically connected to the pressure sensor 12 and the further pressure sensor 30.

Example 27. Method according to example 26, wherein the sensor arrangement 10 comprises the pressure sensor 12, the further pressure sensor 30 and the capacitance-to-digital converter 13 and the sensor arrangement is integrated on a single semiconductor body 11.

Example 28. Method of operating a sensor arrangement, comprising measuring a capacitance of at least one sensor of a group consisting of a pressure sensor 12 and a further pressure sensor 30 by a capacitance-to-digital converter 13 as a function of a reference voltage, a bias voltage or a source voltage VCM provided to the sensor by the capacitance-to-digital converter 13.

Example 29. Method according to example 28, wherein the reference voltage, the bias voltage or the source voltage VCM is a DC voltage.

Example 30. Method according to example 28 or 29, wherein the reference voltage, the bias voltage or the source voltage VCM is applied between a first electrode of the pressure sensor and a second electrode of the pressure sensor.

Example 31. Method according to one of examples 28 to 30, wherein the reference voltage, the bias voltage or the source voltage VCM is applied between a third electrode of the further pressure sensor and a fourth electrode of the further pressure sensor.

Example 32. Method according to one of examples 28 to 31, wherein in a test phase of operation, at least two different values of the reference voltage are provided by the capacitance-to-digital converter 13 to the sensor and the capacitance-to-digital converter 13 generates at least two values of a digital signal depending on a capacitance value of the sensor, and a digital circuit 20 generates a parameter A0 and/or correction data depending on the at least two values of the digital signal.

The embodiments shown in the FIGS. 1A to 5B as stated represent example embodiments of the improved sensor arrangement, therefore they do not constitute a complete list of all embodiments according to the improved sensor arrangement. Actual sensor arrangement configurations may vary from the embodiments shown in terms of circuit parts, shape, size and materials, for example.

Although the invention has been illustrated and described in detail by means of the preferred embodiment examples, the present invention is not restricted by the disclosed examples and other variations may be derived by the skilled person without exceeding the scope of protection of the invention.

The invention claimed is:
1. A sensor arrangement comprising:
 a pressure sensor realized as a capacitive pressure sensor;
 a capacitance-to-digital converter coupled to the pressure sensor and implemented as a delta-sigma analog-to-digital converter;

a reference voltage generator having a control input configured to receive a control signal and an output configured to provide a reference voltage;

a digital circuit coupled to the capacitance-to-digital converter and the reference voltage generator, the digital circuit being configured to generate the control signal; and a memory connected to the digital circuit, wherein the output of the reference voltage generator is connected to an input of the capacitance-to-digital converter, wherein the reference voltage generator is configured to set a value of the reference voltage as a function of the control signal, wherein, in a test phase, the digital circuit is configured to control the reference voltage generator by the control signal such that the reference voltage generator consecutively generates at least two different values of the reference voltage which have the same sign and different amounts, wherein, in the test phase, the capacitance-to-digital converter is configured to generate at least two values of a digital signal depending on a capacitance value of the pressure sensor, and wherein, in the test phase, the digital circuit to configured to generate a parameter and/or correction data depending on the at least two values of the digital signal and the values of the reference voltage.

2. The sensor arrangement according to claim 1, wherein a semiconductor body of the sensor arrangement comprises the pressure sensor and the capacitance-to-digital converter.

3. The sensor arrangement according to claim 1, further comprising a further pressure sensor realized as a capacitive pressure sensor, wherein the capacitance-to-digital converter is coupled to the further pressure sensor.

4. The sensor arrangement according to claim 3, wherein a semiconductor body of the sensor arrangement comprises the pressure sensor, the further pressure sensor and the capacitance-to-digital converter.

5. The sensor arrangement according to claim 3, wherein the sensor arrangement is configured to determine a mismatch between the pressure sensor and the further pressure sensor.

6. The sensor arrangement according to claim 1, wherein the digital circuit is configured to store the parameter or the correction data in the memory.

7. The sensor arrangement according to claim 1, wherein, in a measurement phase, the digital circuit is configured to generate a digitized pressure signal depending on a digital signal provided by the capacitance-to-digital converter and depending on a parameter and/or correction data stored in the memory.

8. The sensor arrangement according to claim 1, wherein the digital circuit is configured to control the reference voltage generator by the control signal such that the reference voltage generator consecutively generates the at least two different values of the reference voltage.

9. An apparatus comprising the sensor arrangement of claim 1, wherein the apparatus is a mobile device, a wearable, a medical device, a vehicle or an air conditioner.

10. A method for operating a sensor arrangement, wherein the sensor arrangement comprises a pressure sensor, a capacitance-to-digital converter, a reference voltage generator and a digital circuit wherein an output of the reference voltage generator is connected to an input of the capacitance-to-digital converter, and wherein the digital circuit is coupled to the capacitance-to-digital converter and the reference voltage generator, the method comprising:

receiving, at a control input of the reference voltage generator, a control signal from the digital circuit;

providing, at the output of the reference voltage generator, a reference voltage having a value as a function of the control signal; and measuring, by the capacitance-to-digital converter, a capacitance of the pressure sensor as a function of the reference voltage provided to the pressure sensor by the capacitance-to-digital converter, consecutively providing, by the capacitance-to-digital converter, in a test phase, at least two different values of the reference voltage which have the same sign and different amounts to the pressure sensor;

generating, by the capacitance-to-digital converter, in the test phase, at least two values of a digital signal depending on a capacitance value of the pressure sensor; and generating by the digital circuit, in the test phase, a parameter and/or correction data depending on the at least two values of the digital signal and the values of the reference voltage, wherein the pressure sensor is a capacitive pressure sensor, and wherein the capacitance-to-digital converter is a delta-sigma analog-to-digital converter.

11. The method according to claim 10, wherein the reference voltage is a DC voltage.

12. The method according to claim 10, wherein the reference voltage is applied between a first electrode of the pressure sensor and a second electrode of the pressure sensor.

* * * * *